US010298216B2

(12) United States Patent
Harada et al.

(10) Patent No.: US 10,298,216 B2
(45) Date of Patent: May 21, 2019

(54) SEMICONDUCTOR DEVICE

(71) Applicant: OLYMPUS CORPORATION, Hachioji-shi, Tokyo (JP)

(72) Inventors: Yasunari Harada, Ebina (JP); Masato Osawa, Tokyo (JP); Hideki Kato, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/837,299

(22) Filed: Dec. 11, 2017

(65) Prior Publication Data

US 2018/0102768 A1    Apr. 12, 2018

Related U.S. Application Data

(63) Continuation of application No. PCT/JP2015/067182, filed on Jun. 15, 2015.

(51) Int. Cl.
*H03L 5/00* (2006.01)
*H03K 5/08* (2006.01)
(Continued)

(52) U.S. Cl.
CPC .................. *H03K 5/08* (2013.01); *H03F 3/45* (2013.01); *H03F 3/45188* (2013.01);
(Continued)

(58) Field of Classification Search
CPC . H04N 5/32; H04N 5/378; H01L 2224/48091
See application file for complete search history.

(56) References Cited

U.S. PATENT DOCUMENTS 5,914,638 A * 6/1999 He ........................ G11C 27/026
327/96
2012/0112937 A1* 5/2012 Yamase ................. H03M 1/462
341/110

(Continued)

FOREIGN PATENT DOCUMENTS

JP     2000-224495 A    8/2000
JP      2001-6385 A     1/2001
JP     2010-166447 A    7/2010

OTHER PUBLICATIONS

International Search Report dated Sep. 1, 2015, issued in counterpart International Application No. PCT/JP2015/067182, w/English translation (2 pages).

*Primary Examiner* — Sibin Chen
(74) *Attorney, Agent, or Firm* — Westerman, Hattori, Daniels & Adrian, LLP

(57) ABSTRACT

A semiconductor device is provided that includes an amplification circuit, a downstream circuit, and a clipping circuit. The amplification circuit includes a sampling capacitor, a feedback capacitor, and an operational amplifier circuit. The sampling capacitor holds air input signal on which sampling is performed, as a signal whose reference is a first reference voltage. The signal that is held in the sampling capacitor is transferred to the feedback capacitor. The operational amplifier circuit amplifies the signal that is held in the sampling capacitor, according to a ratio between values of the sampling capacitor and the feedback capacitor, and outputs the amplified signal, as a signal whose reference is a second reference voltage. The clipping circuit limits a voltage of an output signal of the operational amplifier circuit to a predetermined voltage or below.

8 Claims, 10 Drawing Sheets

(51) Int. Cl.
  *H04N 5/374* (2011.01)
  *H04N 5/378* (2011.01)
  *H03F 3/45* (2006.01)
  *H03M 1/10* (2006.01)
  *H03M 1/46* (2006.01)

(52) U.S. Cl.
  CPC ..... *H03F 3/45475* (2013.01); *H03F 3/45659* (2013.01); *H04N 5/374* (2013.01); *H04N 5/378* (2013.01); *H03F 2203/45288* (2013.01); *H03F 2203/45424* (2013.01); *H03F 2203/45514* (2013.01); *H03F 2203/45551* (2013.01); *H03M 1/1014* (2013.01); *H03M 1/1061* (2013.01); *H03M 1/468* (2013.01)

(56) References Cited

U.S. PATENT DOCUMENTS

| | | | |
|---|---|---|---|
| 2012/0119088 A1* | 5/2012 | Honda | G01J 5/025 250/332 |
| 2013/0163136 A1* | 6/2013 | Chang | H02H 3/087 361/87 |
| 2013/0285705 A1* | 10/2013 | Kabir | G11C 27/02 327/94 |

* cited by examiner

SEMICONDUCTOR DEVICE

The present application is a continuation application based on International Patent Application No. PCT/JP2015/067182 filed Jun. 15, 2015, the content of which is incorporated, herein by reference.

BACKGROUND OF THE INVENTION

Field of the Invention

The present invention relates to a semiconductor device, and more specifically to a technology for suppressing electric current consumption.

Description of Related Art

A semiconductor device in the related art, which is used for an imaging device, for example, such as a digital camera, includes a circuit that performs correlation double sampling processing on an output signal (a pixel signal) of a pixel, an amplification circuit that amplifies the pixel signal on which the correlation double sampling processing is performed, an A/D conversion circuit that performs A/D conversion of the amplified pixel signal, and the like. In this type of semiconductor device, because of the need to secure a dynamic range of a pixel signal, the pixel or the amplification circuit is caused to operate at a high power source voltage, and because of the need to realize a reduction in power consumption, the A/D conversion circuit is caused to operate at a low power source voltage. For this reason, this type of semiconductor device includes a level shift circuit for converting a signal level of the output signal of the pixel into a signal level suitable for the A/D conversion circuit in a low power source voltage system like Japanese Unexamined Patent Application, First Publication No 2000-224495.

SUMMARY OF THE INVENTION

A semiconductor device according to a first aspect of the present invention includes an amplification circuit, a downstream circuit, and a clipping circuit. The amplification circuit performs sampling on an input signal and amplifies the input signal. The downstream circuit operates in response to an output signal of the amplification circuit. The amplification circuit includes a sampling capacitor, a feedback capacitor, and an operational amplifier circuit. The sampling capacitor holds the input signal on which the sampling is performed, as a signal whose reference is a first reference voltage. The signal that is held in the sampling capacitor is transferred to the feedback capacitor. The operational amplifier circuit amplifies the signal that is held in the sampling capacitor, according to a ratio between values of the sampling capacitor and the feedback capacitor, and outputs the amplified signal, as a signal whose reference is a second reference voltage. The clipping circuit limits a voltage of an output signal of the operational amplifier circuit to a predetermined voltage or below.

According to a second aspect of the present invention, in the first aspect, the first reference voltage may be a voltage that is higher than the second reference voltage.

According to a third aspect of the present invention, the first aspect or the second aspect, the first reference voltage may be set to a voltage within a range of one fourth to three fourths of a first power source voltage that is supplied to the operational amplifier circuit. The second reference voltage may be set to a voltage within one fourth to three fourths of a second power source voltage that is supplied to the downstream circuit.

According to a fourth aspect of the present invention, in the first aspect, the clipping circuit may include an overcurrent detection circuit and an overcurrent absorption circuit. The overcurrent detection circuit detects an overcurrent that occurs in a case where the voltage of the output signal of the operational amplifier circuit exceeds the second power source voltage that is supplied to the downstream circuit. The overcurrent absorption circuit absorbs the overcurrent.

According to a fifth aspect of the present invention, in any one of the first aspect to the fourth aspect, the semiconductor device may further include multiple pixels that are arranged in a matrix form. One or more amplification circuits 12 may be arranged with respect to columns of the multiple pixels.

According to a sixth aspect of the present invention, in any one of the first aspect to the fifth aspect, the downstream circuit may be a successive approximation type A/D conversion circuit.

According to a seventh aspect of the present invention, in any one of the first aspect to the sixth aspect, the operational amplifier circuit may be a transconductance amplifier.

According to an eighth aspect of the present invention, in the seventh aspect, the operational amplifier circuit may be a telescopic-type transconductance amplifier.

DETAILED DESCRIPTION OF THE INVENTION

Embodiments of the present invention will be described with reference to the drawings.

(First Embodiment)

Figure 1:
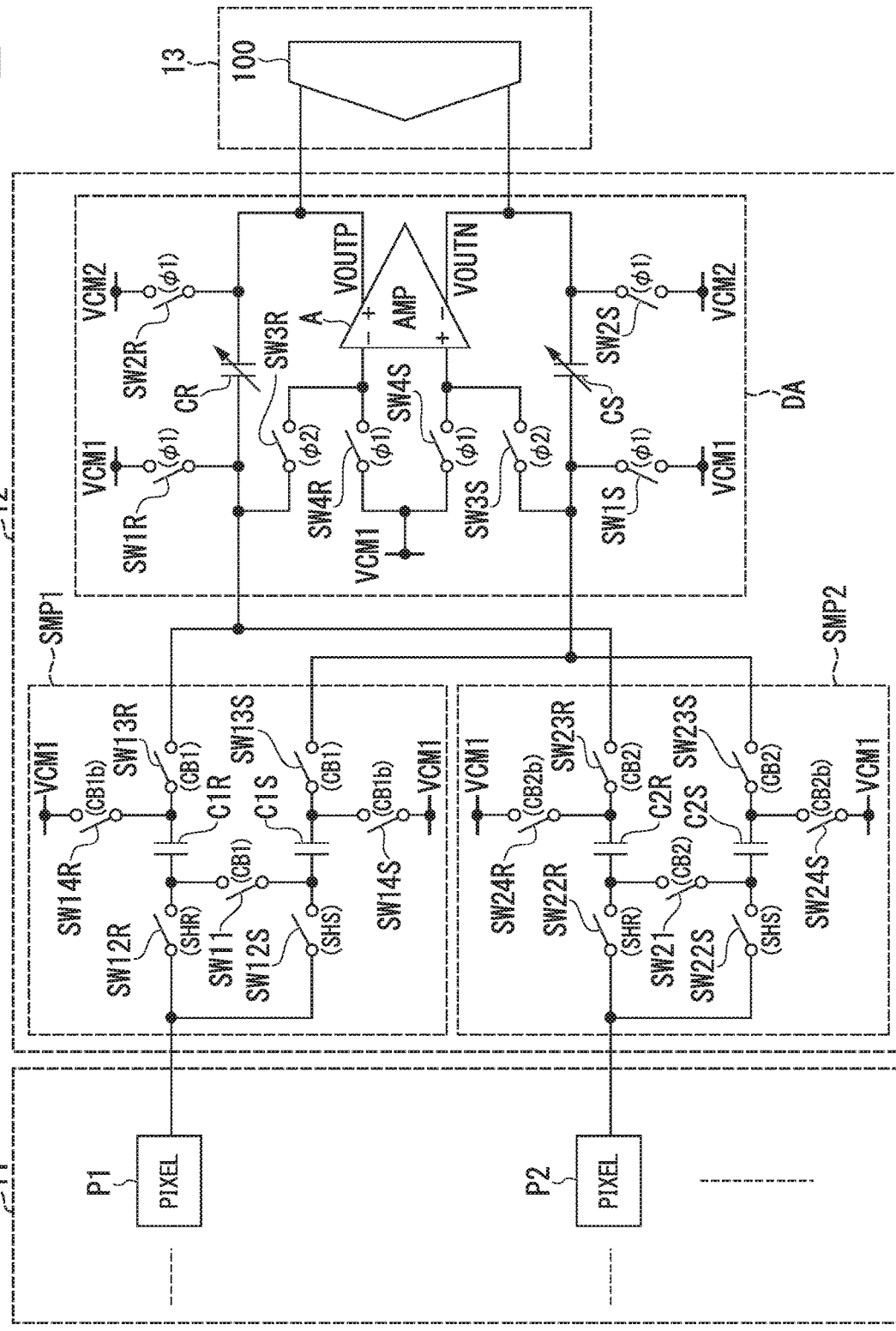
FIG. 1 is a diagram showing an example of a configuration of a semiconductor device according to a first embodiment of the present invention.

FIG. 1 is a diagram showing an example of a configuration of a semiconductor device 10 according to a first embodiment of the present invention.

The semiconductor device 10 is configured with a pixel array 11, an amplification circuit 12, and a downstream circuit 13. The pixel array 11 is configured with multiple pixels (P1, P2, and so on) that are arranged in a matrix form. The pixel array 11 photoelectrically converts an optical image that results from image formation by an optical system that is not shown, and outputs a pixel signal to the amplification circuit 12. The amplification circuit 12 is an element for performing sampling and amplification on the pixel signal that is input from the pixel array 11 as an input signal.

The amplification circuit 12 amplifies a difference between a reset signal and an image signal that are output as the image signals from each pixel in the pixel army 11, and outputs the amplified difference. The reset signal and the image signal here are pixel signals that are used in correlation double sampling processing. Of these, the reset signal is a pixel signal in an initial state before reading the image signal, and the image signal is a pixel signal that includes an image component that is superimposed on the reset signal. The downstream circuit 13 is an element that operates in response to an output signal of the amplification circuit 12. In the first embodiment, the downstream circuit 13 is configured with an A/D conversion circuit 100 that performs analog/digital conversion (hereinafter referred to as A/D conversion) on the output signal of the amplification circuit 12. The output signal of the A/D conversion circuit 100 is supplied to an arbitrary digital signal processing circuit that is not shown.

It should be noted that the semiconductor device 10 may include only the amplification circuit 12 as a constituent element thereof, and may include the amplification circuit 12 and the downstream circuit 13 as constituent elements thereof. Furthermore, a circuit form of the A/D conversion circuit is arbitrary, but a digital form of the A/D conversion circuit is more preferable than an analog form thereof, in terms of reducing power consumption and power source voltage.

A configuration of the amplification circuit 12 will be described in detail.

One or more amplification circuits 12 are arranged with respect to columns of multiple pixels. In FIG. 1, an example is shown in which one amplification circuit 12 is positioned, but two or more amplification circuits 12 may be arranged.

The amplification circuit 12 includes a sampling circuit SMP1 for performing the sampling on a pixel signal that is input from a pixel column to which a pixel P1 that constitutes the pixel array 11 belongs, a sampling circuit SMP2 for performing the sampling on an image signal that is input from a pixel column to which a pixel P2 that constitutes the pixel array 11 belongs, and a difference signal amplification circuit DA that amplifies a signal that is a difference between a reset signal and an image signal that are included in pixel signals that are output from the sampling circuits SMP1 and SMP2 described above, respectively. As will be described below, the amplification by the amplification circuit 12 is performed according to ratios between values of sampling capacitors C1R and C1S that constitute the sampling circuit SMP1 and values of feedback capacitors CR and CS that constitute the difference signal amplification circuit DA.

Control signals SHR, SHS, CB1, CB1b, φ1, φ2, and the like that are shown in FIG. 1 are output from a control signal generation circuit that is not shown.

The sampling circuit SMP1 includes the sampling capacitors C1R and C1S, and switches SW11, SW12R, SW12S, SW13R, SW13S, SW14R, and SW14S. A first terminal of the switch SW12R and a first terminal of the switch SW12S are connected to a signal line in the pixel column to which the pixel P1 belongs in a manner that shares the signal line. The switch SW11 is connected between a second terminal of the switch SW12R and a second terminal of the switch SW12S. The switch SW12R is an element that samples the reset signal, which is supplied as the pixel signal from the pixel column to which the pixel P1 belongs, and causes the sampling capacitor C1R to hold the sampled reset signal. A first electrode of the sampling capacitor C1R is connected to the second terminal of the switch SW12R. The switch SW14R is connected between a second electrode of the sampling capacitor C1R and a first reference voltage VCM1. A first electrode of the switch SW13R is connected to the second electrode of the sampling capacitor C1R. The switch SW13R is an element for transferring an electric charge of the signal that is held in the sampling capacitor C1R to the feedback capacitor CR. When the switch SW13R is controlled to be in a closed state, the signal that is held in the sampling capacitor C1R is transferred to the feedback capacitor CR through the switch SW13R.

The switch SW12S is an element that samples the image signal, which is supplied as the pixel signal from the pixel column to which the pixel P1 belongs, and causes the sampling capacitor C1S to hold the sampled reset signal. A first electrode of the sampling capacitor C1S is connected to the second terminal of the switch SW12S. The switch SW14S is connected between a second electrode of the sampling capacitor C1S and the first reference voltage VCM1. A first terminal of the switch SW13S is connected to the second electrode of the sampling capacitor C1S. The switch SW13S is an element that transfers the electric charge of the signal, which is held in the sampling capacitor C1S, to the feedback capacitor CS. When the switch SW13S is controlled to be in the closed state, the signal that is held in the sampling capacitor C1S is transferred to the feedback capacitor CS through the switch SW13S.

The opening and closing of the switch SW12R are controlled by a control signal SHR, and the opening and closing of the switch SW12S are controlled by a control signal SHS. The opening and closing of the switches SW11, SW13R, and SW13S are controlled by a control signal CB1 that is not shown, and the opening and closing of the switches SW14R and SW14S are controlled by a control signal CB1b (a signal that results from inverting the control signal CB1) that is not shown.

the sampling circuit SMP2 is configured in the same manner as the sampling circuit SMP1.

The sampling circuit SMP2 includes sampling capacitors C2R and C2S, and switches SW21, SW22R, SW22S, SW23R, SW23S, SW24R, and SW24S. A first terminal of the switch SW22R and a first terminal of the switch SW22S are connected to a signal line in a pixel column to which the pixel P2 belongs, in a manner that shares the signal line. The switch SW21 is connected between a second terminal of the switch SW22R and a second terminal of the switch SW22S.

The switch SW22R is an element that samples the reset signal, which is supplied as the pixel signal from the pixel column to which the pixel P2 belongs, and transfers the sampled reset signal to the sampling capacitor C2R. A first electrode of the sampling capacitor C2R is connected to the second terminal of the switch SW22R. The switch SW24R is connected between a second electrode of the sampling capacitor C2R and the first reference voltage VCM1. A first electrode of the switch SW23R is connected to the second electrode of the sampling capacitor C2R. The switch SW23R is an element for transferring an electric charge of the signal that is held in the sampling capacitor C2R to the feedback capacitor CR.

A first electrode of the sampling capacitor C2S is connected to the second terminal of the switch SW22S. The switch SW22S is an element that samples the image signal, which is supplied as the pixel signal from the pixel column to which the pixel P2 belongs, and causes the sampling capacitor C2S to hold the sampled reset signal. The switch SW24S is connected between a second electrode of the sampling capacitor C2S and the first reference voltage VCM1. A first terminal of the switch SW23S is connected to the second electrode of the sampling capacitor C2S. The switch SW23S is an element for transferring the electric charge of the signal, which is held in the sampling capacitor C2S, to the feedback capacitor CS.

The opening and closing of the switch SW22R are controlled by the control signal SHR, and the opening and closing of the switch SW22S are controlled by the control signal SHS. The opening and closing of the switches SW21, SW23R, and SW23S are controlled by a control signal CB2 that is not shown, and the opening and closing of the switches SW24R and SW24S are controlled by a control signal. CB2b (a signal that results from inverting the control signal CB2) that is not shown.

It should be noted that in an example in FIG. 1, the two sampling circuits SMP1 and SMP2 are shown, but that sampling circuits that are the same as the sampling circuits SMP1 and SMP2 are individually provided in each of the multiple pixel columns that constitute the pixel array 11. The sampling circuits SMP1 and SMP2 are elements that function as column circuits for selecting the pixel signal that is output from the pixel array 11.

The difference signal amplification circuit DA includes the feedback capacitors CR and CS, the switches SW1R, SW1S, SW2R, SW2S, SW3R, SW3S, SW4R, and SW4S, and an operational amplifier circuit A.

A second terminal of the switch SW13R that constitutes the sampling circuit SMP1 described above, and a second terminal of the switch SW23R that constitutes the sampling circuit SMP2 described above are connected to a first electrode of the feedback capacitor CR in a manner that shares the first electrode of the feedback capacitor CR. The switch SW1R is connected between the first electrode of the feedback capacitor CR and the first reference voltage VCM1. The switch SW3R is connected between the first electrode of the feedback capacitor CR and an inversion input unit of the operational amplifier circuit A. The switch SW4R is connected between the inversion input unit of the operational amplifier circuit A and the first reference voltage VCM1. The switch SW2R is connected between a second electrode of the feedback capacitor CR and a second reference voltage VCM2. The second electrode of the feedback capacitor CR is connected to a non-inversion output unit of the operational amplifier circuit A.

A second terminal of the switch SW13S that constitutes the sampling circuit SMP1 described above, and a second terminal of the switch SW23S that constitutes the sampling circuit SMP2 described above are connected to a first electrode of the feedback capacitor CS in a manner that shares the first electrode of the feedback capacitor CS. The switch SW1S is connected between the first electrode of the feedback capacitor CS and the first reference voltage VCM1. The switch SW3S is connected between the first electrode of the feedback capacitor CS and a non-inversion input unit of the operational amplifier circuit A. The switch SW4S is connected between the non-inversion input unit of the operational amplifier circuit A and the first reference voltage VCM1. The switch SW2S is connected between a second electrode of the feedback capacitor CS and the second reference voltage VCM2. The second electrode of the feedback capacitor CS is connected to an inversion output unit of the operational amplifier circuit A. The opening and closing of the switches SW1R, SW1S, SW2R, SW2S, SW4R, and SW4S are controlled by a control signal $\varphi 1$ that is not shown, and the opening and closing of the switches SW3R and SW3S are controlled by a control signal $\varphi 2$ that is not shown.

An output voltage VOUTP and an output voltage VOUTN are output from the non-inversion output unit and the inversion output unit, respectively, of the operational amplifier circuit A that constitutes the difference signal amplification circuit DA. The output voltage VOUTP and the output voltage VOUTN of the operational amplifier circuit A are input into the A/D conversion circuit 100 that constitutes the downstream circuit 13, and a signal that a difference between the output voltage VOUTP and the output voltage VOUTN of the operational amplifier circuit A is converted into a digital signal.

The amplification circuit 12 is configured as a so-called switched capacitor circuit. The amplification circuit 12 discretely performs amplification processing on the signal that is the difference between the reset signal and the image signal that are input, as the pixel signals, from the pixel array 11 and then outputs the signal, on which the amplification processing is performed, to the downstream circuit 13 (the A/D conversion circuit 100).

In the first embodiment, the second reference voltage VCM2 is a voltage that is lower than the first reference voltage VCM1. In other words, the first reference voltage VCM1 is a voltage that is higher than the second reference voltage VCM2. In a configuration in FIG. 1, by using the first reference voltage VCM1 and the second reference voltage VCM2, node voltages between the sampling capacitors C1R and C1S, between the sampling capacitors C2R and C2S and between the feedback capacitors CR and CS are initialized to the first reference voltage VCM1, and the output voltages VOUTP and VOUTN are initialized to the second reference voltage VCM2.

Figure 2:
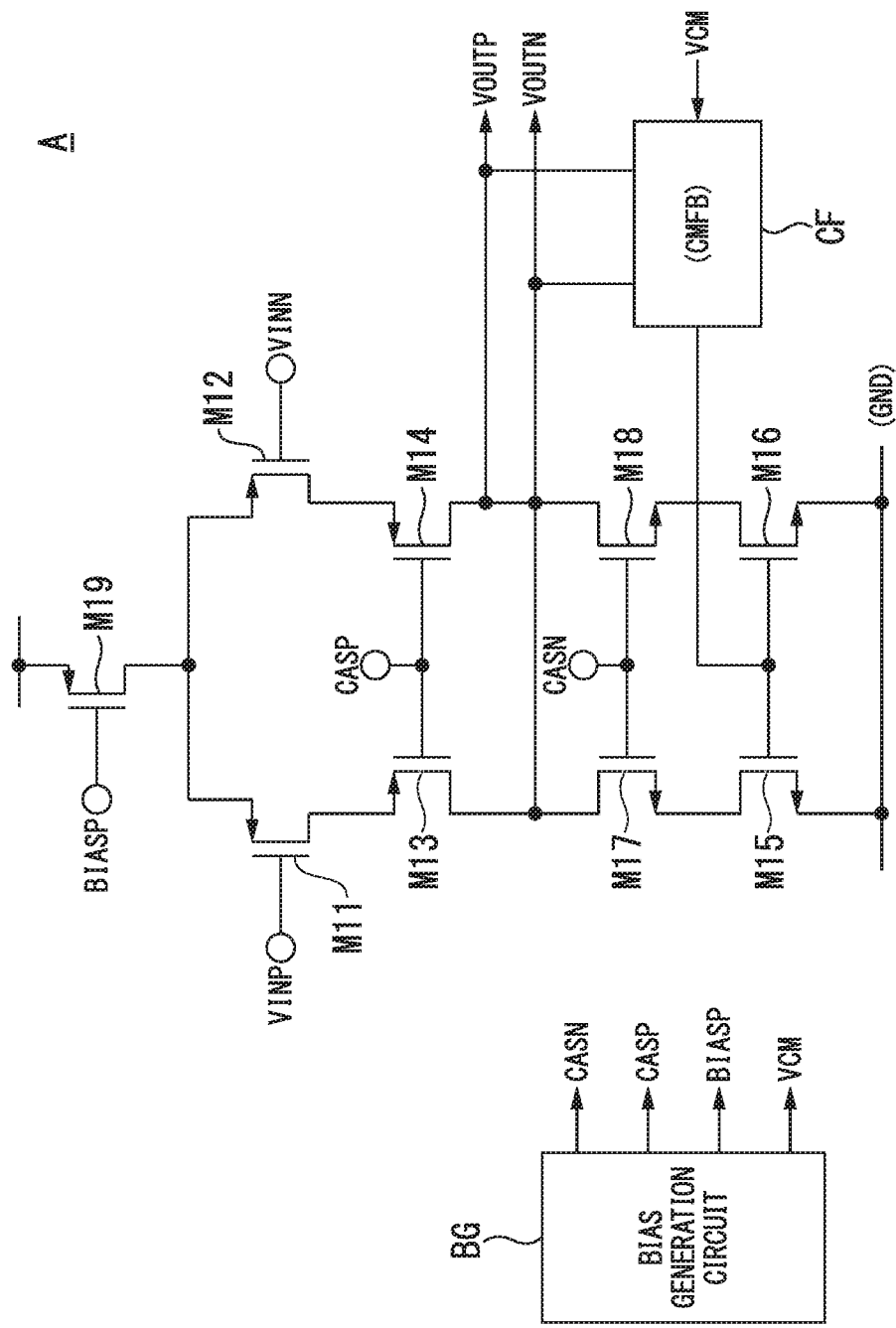
FIG. 2 is a diagram showing an example of a configuration of an operational amplifier circuit that is included in the semiconductor device according to the first embodiment of the present invention.

FIG. 2 is a diagram showing an example of a configuration of the operational amplifier circuit A that is included in the semiconductor device 10 according to the first embodiment of the present invention. The operational amplifier circuit A that is shown in FIG. 2 is a telescopic-type transconductance amplifier that is one type of operational transconductance amplifier. The operational amplifier circuit A is not limited to this example and can be configured with an arbitrary circuit form of an amplifier.

The operational amplifier circuit A is configured with transistors M11 and M12 (P-type field effect transistors) that form an input differential pair, transistors M13 and M14 (P-type field effect transistors) that form a cascode circuit for the input differential pair, transistors M15 and M16 (N-type field effect transistors) that form an active load, transistors M17 and M18 (N-type field effect transistors) that form a cascode circuit for the active load, a transistor M19 (a P-type field effect transistor) that forms a constant current source, a bias generation circuit BG, and a common mode feedback (CMFB) circuit CF.

The bias generation circuit BG generates a bias voltage VCM that is supplied to the common mode feedback circuit CF, a bias signal CASP that biases gates of the transistors M13 and M14, a bias signal CASN that biases gates of the transistors M17 and M18, and a bias signal BIASP that biases a gate of the transistor M19. The bias voltage VCM that is generated by the bias generation circuit BG is set to the second reference voltage VCM2. The common mode feedback circuit CF adjusts gate voltages of the transistors M15 and M16 that form the active load in such a manner that the output voltages VOUTP and VOUTN are generated using the bias voltage VCM (=VCM2) that is supplied from the bias generation circuit BG as a reference voltage (a center voltage).

With the operational amplifier circuit A that is the telescopic-type transconductance amplifier, the reduction in power consumption can be achieved. Furthermore, the telescopic-type transconductance amplifier is used as the operational amplifier circuit A, and thus, in comparison with an amplifier that has a different type of circuit, a high frequency property can be improved and a high gain can be obtained.

Next, an operation of the semiconductor device 10 according to the first embodiment will be described with reference to FIG. 3.

Figure 3:
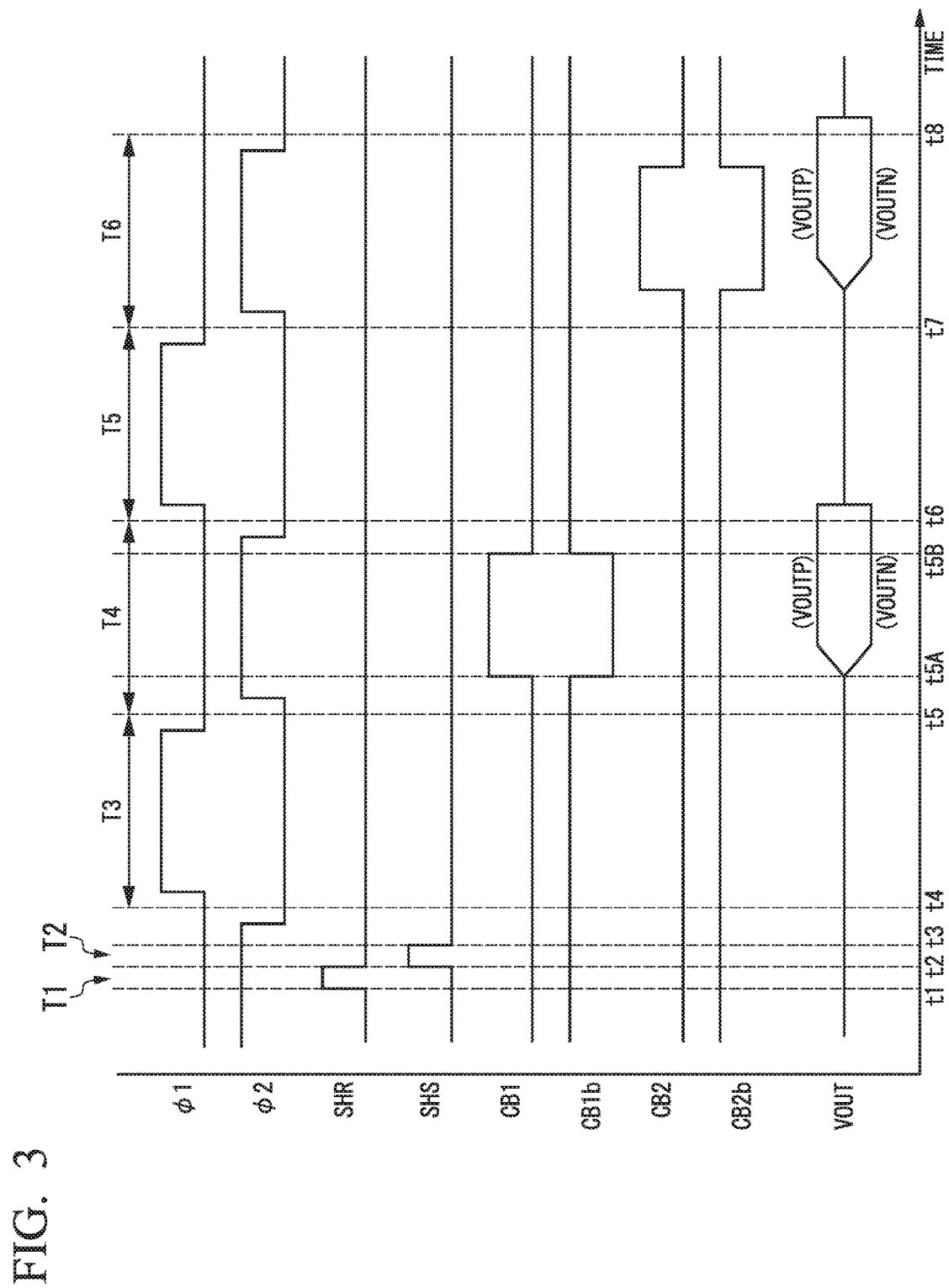
FIG. 3 is a timing chart describing an example of an operation of the semiconductor device according to the first embodiment of the present invention.

FIG. 3 is a timing chart describing an example of the operation of the semiconductor device 10 according to the first embodiment of the present invention.

For brief description, the operation of the semiconductor device 10 that is shown in FIG. 1 will be described focusing on the sampling circuit SMP1 among constituent elements of the semiconductor device 10, but operations focusing on other constituent elements, such as the sampling circuit SMP2, are the same as those in the case focusing on the sampling circuit SMP1.

In FIG. 3, in an initial state before a time t1, the control signal φ1 is at a low level, and thus the switches SW1R, SW1S, SW2R, SW2S, SW4R and SW4S of the difference signal amplification circuit DA are set in an opened state. Furthermore, the control signal φ2 is at a high level, and thus the switches SW3R and SW3S are set in a closed state. Furthermore, the control signal SHR and the control signal SHS are at the low level, and thus the switches SW12R and SW12S of the sampling circuit SMP1 and the switches SW22R and SW22S of the sampling circuit SMP2 are set in the opened state.

Furthermore, in the initial state described above, the control signal CB1 is at the low level, the control signal CB1b is at the high level, and thus the switches SW11, SW13R, and SW13S of the sampling circuit SMP1 are set in the opened state, and the switches SW14R and SW14S are set in the closed state. Furthermore, the control signal CB2 is at the low level and the control signal CB2b is at the high level, and thus the switches SW21, SW23R, and SW23S of the sampling circuit SMP2 are set in the opened state and the switches SW24R and SW24S are set in the closed state. In this initial state, the first reference voltage VCM1 is applied to the second electrode of the sampling capacitor C1R and the second electrode of the sampling capacitor C1S through the switches SW14R and SW14S that are set in the closed state by the control signal CB1b.

When the control signal SHR becomes at the high level during a period T1 from the time t1 to a time t2 starting from the initial state described above, the switch SW12R of the sampling circuit SMP1 becomes in the closed state. For this reason, the reset signal that is supplied as the pixel signal from the pixel P1 is supplied to the first electrode of the sampling capacitor C1R through the switch SW12R. In other words, the sampling is performed on the reset signal that is supplied from the pixel P1, and the reset signal is held in the sampling capacitor C1R. In this case, because the first reference voltage VCM1 is supplied to the second electrode of the sampling capacitor C1R through the switch SW14R, the sampling capacitor C1R holds the reset signal on which the sampling is performed, as a signal whose reference is the first reference voltage VCM1.

Subsequently, the control signal SHR becomes at the low level at the time t2, and the control signal SHS becomes at the high level during a period T2 from in the time t2 to a time t3. Accordingly, the image signal that is supplied as the pixel signal from the pixel P1 is supplied to the first electrode of the sampling capacitor C1S through the switch SW12S. In other words, the sampling is performed on the image signal that is supplied from the pixel P1, and the image signal is held in the sampling capacitor C1S. In this case, because the first reference voltage VCM1 is supplied to the second electrode of the sampling capacitor C1S through the switch SW14S, the sampling capacitor C1S holds the image signal on which the sampling is performed, as a signal whose reference is the first reference voltage VCM1.

After the control signal SHS transitions to the low level at the time t3, when the control signal φ2 transitions to the low level, the switches SW3R and SW3S of the difference signal amplification circuit DA become in the opened state. Accordingly, the first electrode of the feedback capacitor CR and the inversion input unit of the operational amplifier circuit A become separated, and the first electrode of the feedback capacitor CS and the non-inversion input unit of the operational amplifier circuit A become separated.

Subsequently, a reset operation is performed during a reset period T3 from a time t4 to a time t5. More specifically, when a fixed time elapses after the time t4, the control signal φ1 transitions from the low level to the high level. Accordingly, the switches SW1R, SW1S, SW2R, SW2S, SW3R, and SW3S of the difference signal amplification circuit DA become in the closed state. As a result, the first reference voltage VCM1 is applied to the first electrode of the feedback capacitor CR, the second reference voltage VCM2 is applied to the second electrode of the feedback capacitor CR, and the feedback capacitor CR is charged with a voltage (VCM1~VCM2) that is a difference between the first reference voltage VCM1 and the second reference voltage VCM2.

Subsequently, during the reset period T3, when the control signal φ1 transitions from the high level to the low level, the switches SW1R, SW1S, SW2R, SW2S, SW4R, and SW4S of the difference signal amplification circuit DA become in the opened state.

Subsequently, during an amplification period T4 from the time t5 to a time t6, an operation of amplifying the pixel signals (each of winch is the signal that is the difference between the reset signal and the image signal) that are held in the sampling capacitors C1R and C1S of the sampling circuit SMP1, respectively, are performed. More specifically, when a fixed time elapses after the time t5, the control signal φ2 transitions from the low level to the high level. Accordingly, the switches SW3R and SW3S of the difference signal amplification circuit DA become in the closed state. As a result, the inversion input unit of the operational amplifier circuit A becomes connected to the first electrode of the feedback capacitor CR through the switch SW3R, and the non-inversion input unit of the operational amplifier circuit A becomes connected to the first electrode of the feedback capacitor CS through the switch SW3S. Accordingly, a state is attained in which the feedback capacitor CR becomes electrically connected between the inversion input unit and the non-inversion output unit of the operational amplifier circuit A, and the feedback capacitor CS becomes electrically connected between the non-inversion input unit and the inversion output unit of the operational amplifier circuit A. That is, a state is attained in which signal amplification by the difference signal amplification circuit DA is possible.

Subsequently, at a time t5A, when the control signal CB1 transitions from the low level to the high level and the control signal CB1b transitions from the high level to the low level, the switches SW14R and SW14S of the sampling circuit SMP1 become in the opened state, and the switches SW11, SW13R, and SW13S become in the closed state. Accordingly, a state is attained in which the first reference voltage VCM1 becomes separated from the second electrodes of the sampling capacitors C1R and C1S, and the sampling capacitors C1R and C1S and the feedback capacitors CR and CS become connected in series between the non-inversion output unit and the inversion output unit Of the operational amplifier circuit A. As a result, the operational amplifier circuit A amplifies the signal that is the difference between the reset signal and the image signal that constitute the pixel signals from the pixel P1, according to the ratios between values of the sampling capacitors C1R and C1S and values of the feedback capacitors CR and CS, and generates the output voltage VOUT (VOUTP~VOUTN), a reference of which is the second reference voltage VCM2.

Subsequently at a time t5B, when the control signal CB1 transitions from the high level to the low level and the control signal CB1b transitions from the low level to the high level, a state is attained in which the switches SW14R and SW14S of the sampling circuit SMP1 become in the closed state, and the switches SW11, SW13R, and SW13S become in the opened state.

In this manner, the amplification circuit 12 performs the reset operation and the amplification operation sequentially. Thus, according to a timing at which the control signal φ2 becomes at the high level, the amplification circuit 12 amplifies the signal that is the difference between the reset signal and the image signal that are the pixel signals from the pixel P1, according to the ratios between values of the sampling capacitors C1R and C1S and values of the feedback capacitors CR and CS, and outputs the amplified signal to the A/D conversion circuit 100 that constitutes the downstream circuit 13. The A/D conversion circuit 100 converts the output voltage VOUT (an analog signal) of the amplification circuit 12, which is obtained by amplifying the pixel signal from the pixel P1, into a digital signal and outputs the digital signal.

Subsequently, during a reset period T5 from the time t6 to a time t7, the reset operation for amplifying the pixel signal that is output from the pixel P2 in the pixel array 11 is performed, and during an amplification period T6 from the time t7 to a time t8, the amplification operation for amplifying the pixel signal that is output from the pixel P2 in the pixel array 11 is performed. During the reset period T5, in the same manner as during the reset period T3 described above, a state of each switch of the difference signal amplification circuit DA is controlled.

Furthermore, during the amplification period T6, in the same manner as in the state of each switch of the sampling circuit SMP1 during the amplification period T4 described above, a state of each switch of the sampling circuit SMP2 is controlled. As a result, during the amplification period T6, the operational amplifier circuit A amplifies the signal that is the difference between the reset signal and the image signal that constitute the pixel signals from the pixel P2, according to the ratios between values of the sampling capacitors C2R and C2S and values of the feedback capacitors CR and CS, and generates the output voltage VOUT (VOUTP~VOUTN), the reference for which is the second reference voltage VCM2.

In this manner, the amplification circuit 12 performs the reset operation and the amplification operation sequentially. Thus, according to a timing at which the control signal CB (CB1, CB2, and so forth) is at the high level, the amplification circuit 12 amplifies the signal that is the difference between the reset signal and the image signal that are the pixel signals from the pixel P2, according to the ratios between values of the sampling capacitors C2R and C2S and values of the feedback capacitors CR and CS, and outputs the amplified signal to the A/D conversion circuit 100 that constitutes the downstream circuit 13. The A/D conversion circuit 100 converts the output voltage VOUT (an analog signal) of the amplification circuit 12, which is obtained by amplifying the pixel signal from the pixel P2, into a digital signal, and outputs the digital signal.

It should be noted that in an example in FIG. 3, a case is shown in which the pixel signals from two pixels, the pixels P1 and P2 are amplified, but that the amplification circuit 12 repeatedly performs the reset operation and the amplification operation described above on the pixel signals of all the pixels within the pixel array 11.

Next, the amplification operation by the amplification circuit 12 will be described in detail.

The output voltage VOUT of the amplification circuit 12 is given by Equation (1) that follows.

In Equation (1), it is assumed that the sampling capacitors C1R, C1S, C2R, and C2S are "Cs," that the feedback capacitors CR and CS are "Cf", that a voltage of the reset signal that is held in each of the sampling capacitors C1R and C2R is "Vob," and that a voltage of the image signal that is held in each of the sampling capacitor C1S and C2S is "Vsig."

$$VOUTP = Cs/Cf*\{(Vsig+VCM1)~(Vob+VCM1)\}/2 + VCM2 \quad (1)$$

$$VOUTN = Cs/Cf*\{~(Vsig+VCM1)+(Vob+VCM1)\}/2 + VCM2 \quad (2)$$

$$VOUT = VOUTP~VOUTN = Cs/Cf*(Vsig~Vob) \quad (3)$$

As can be understood from Equation (1), the output voltage VOUTP of the amplification circuit 12 is generated by amplifying a signal that is half of the signal (Vsig~Vob) that is the difference between the voltage of the reset signal "Vob" and the voltage of the image signal "Vsig" according to the ratio between values of the sampling capacitor (Cs) and the feedback capacitor (Cf). Furthermore, as can be understood from Equation (2), the output voltage VOUTN of the amplification circuit 12 is generated by amplifying a signal that is half of the signal (~Vsig+Vob) that is the difference between the voltage of the reset signal "Vob" and the voltage of the image signal "Vsig" according to the ratio between values of the sampling capacitor (Cs) and the feedback capacitor (Cf).

Furthermore, as can be understood from Equation (1) and Equation (2), regardless of the first reference voltage VCM1 that is set by a power source voltage of the pixel array 11, the output voltages VOUTP and VOUTN of the amplification circuit 12 are generated as voltage signals, whose reference is the second reference voltage VCM2. This means that a signal level of each of the reset signal and the image signal that constitute the pixel signal is shifted to the voltage signal, the reference for which is the second reference voltage VCM2. Furthermore, as can be understood from Equation (3), the output voltage VOUT of the amplification circuit 12 is expressed as the signal that is the difference between the output voltage VOUTP and the output voltage VOUTN, and does not reflect influences of the first reference voltage VCM1 and the second reference voltage VCM2.

As described above, the amplification circuit 12 sets the first reference voltage VCM1 and the second reference voltage VCM2 to mutually different voltages, respectively, and thus without using a level shift circuit in the related art, level-shifts the pixel signals (Vsig and Vob) from the pixel P1, which are biased toward the first reference voltage VCM1, to the output voltage VOUT (Voutp and Voutn) that is biased toward the second reference voltage VCM2, and outputs the output voltage VOUT.

From the point of view of securing dynamic ranges of the amplification circuit 12 and the downstream circuit 13 (the A/D conversion circuit 100), it is preferable that the first reference voltage VCM1 be suitably set to a voltage that is approximately half of a first power source voltage that is supplied to the pixel P1 and the amplification circuit 12, and that the second reference voltage VCM2 be suitably set to a voltage that is approximately half of a second power source voltage that is supplied to the A/D conversion circuit 100 of the downstream circuit 13. Although the first reference voltage VCM1 is set to a voltage within a range from one fourth to three fourths of the first power source voltage that is supplied to the pixel array 11 and the amplification circuit 12, and although the second reference voltage VCM2 is set to a voltage within a range from one fourth to three fourths of the second power source voltage that is supplied to the A/D conversion circuit 100 of the downstream circuit 13, it is possible that the dynamic ranges of the amplification circuit 12 and the A/D conversion circuit 100 of the downstream circuit 13 are secured.

According to the first embodiment described above, degradation (S/N, power consumption, and a mounting area) in performance due to the level shift circuit as disclosed in the related art can be avoided.

Furthermore, according to the first embodiment because the A/D conversion circuit 100 can be caused to operate at a lower power source voltage than the amplification circuit 12, the reduction in power consumption by the A/D conversion circuit 100 can be realized.

Therefore, according to the first embodiment, the signal level of the pixel signal can be converted into a signal level suitable for a circuit in a desired power source voltage system while suppressing power consumption.

Furthermore, a circuit technology that realizes a level shift function using a high-pass filter is present, but this circuit technology requires securing a mounting area for a capacitor that constitutes the high-pass filter. However, according to the first embodiment, because the level shift function can be realized without using the high-pass filter, the mounting area can be suppressed.

(Second Embodiment)

Next, a second embodiment of the present invention will be described.

Figure 4:
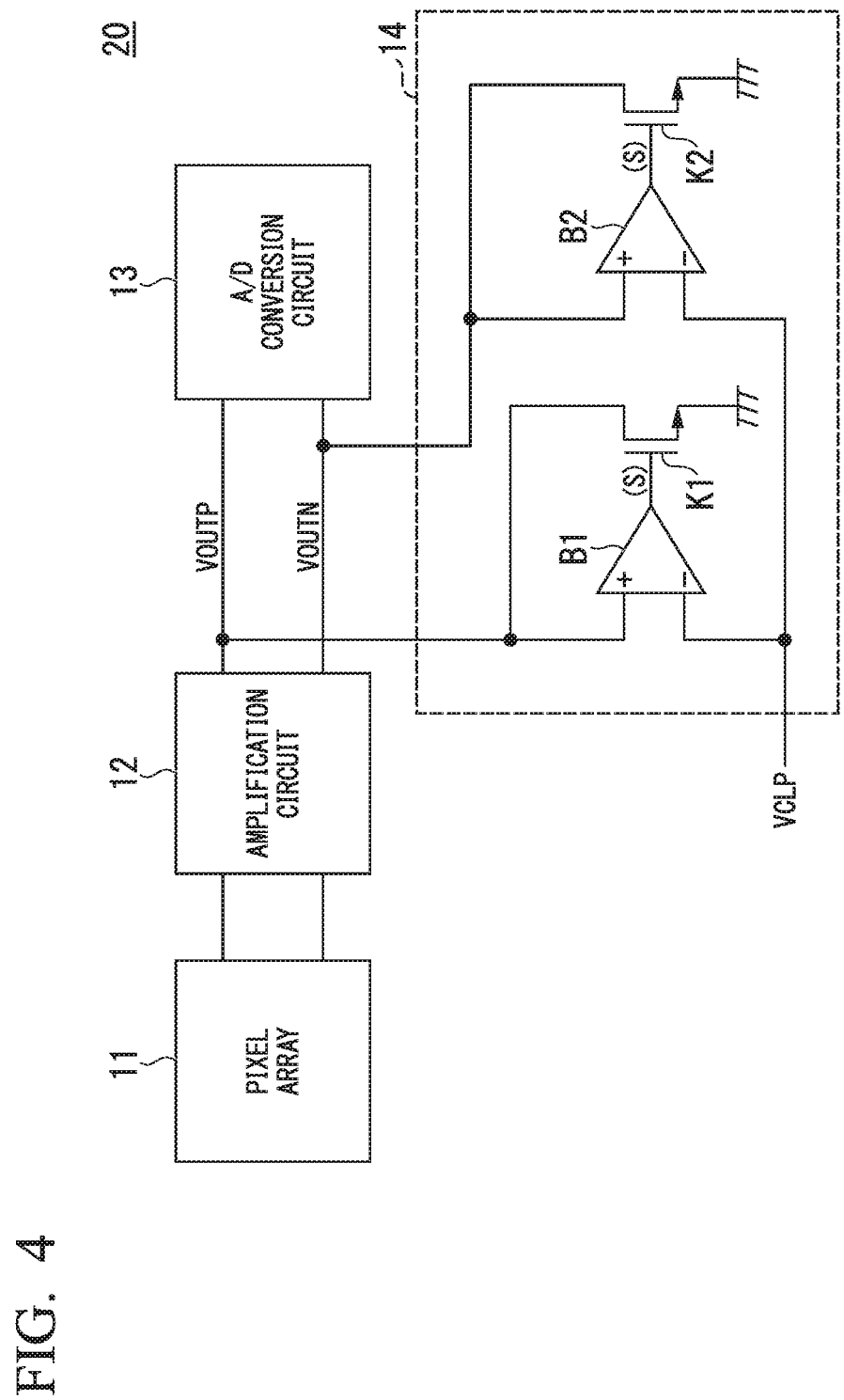
FIG. 4 is a diagram showing an example of a configuration of a semiconductor device according to a second embodiment of the present invention.

FIG. 4 is a diagram showing an example of a configuration of a semiconductor device 20 according to the second embodiment of the present invention.

The semiconductor device 20 further includes the clipping circuit 14 in the configuration according to the first embodiment in FIG. 1. The clipping circuit 14 is an element for limiting the output voltage VOUT (VOUTP and VOUTN) of the operational amplifier circuit A to a predetermined voltage, that is, a predetermined clipping voltage CVLP or below, and is configured with overcurrent detection circuits B1 and B2 and overcurrent absorption circuits K1 and K2. Each of the overcurrent absorption circuits K1 and K2 is configured with an N channel-type field effect transistor (hereafter referred to a "transistor").

A non-inversion input unit of the overcurrent detection circuit B1 is connected to the non-inversion output unit of the operational amplifier circuit A of the amplification circuit 12. The clipping voltage VCLP is applied to an inversion input unit of the overcurrent detection circuit B1. An output unit of the overcurrent detection circuit B1 is connected to a gate of a transistor that constitutes an overcurrent absorption circuit K1. A source of the transistor that constitutes the overcurrent absorption circuit K1 is connected to the ground, and a drain thereof is connected to the non-inversion input unit of the overcurrent detection circuit B1 and the non-inversion output unit of the operational amplifier circuit A of the amplification circuit 12.

The overcurrent detection circuit B1 and the overcurrent absorption circuit K1 are elements for suppressing an overvoltage that occurs in the output voltage VOUTP of the amplification circuit 12. The overcurrent detection circuit B1 is an element for detecting an overcurrent that occurs in a case where the output voltage VOUTP of the operational amplifier circuit A exceeds the second power source voltage that is supplied to the downstream circuit 13. The overcurrent absorption circuit K1 is an element for absorbing an overcurrent due to the output voltage VOUTP. In a case where the output voltage VOUTP of the operational amplifier circuit A exceeds the clipping voltage VCLP, the overcurrent detection circuit B1 causes the overcurrent due to the output voltage VOUTP to be absorbed in the overcurrent absorption circuit K1 by outputting a high-level signal S to the gate of the transistor that constitutes the overcurrent absorption circuit K1 and causing the transistor to be turned on. Accordingly, an overvoltage of the output voltage VOUTP is limited to the clipping voltage VCLP or below.

In the same manner, a non-inversion input unit of the overcurrent detection circuit B2 is connected to the inversion output unit of the operational amplifier circuit A of the amplification circuit 12. The clipping voltage VCLP is applied to an inversion input unit of the overcurrent detection circuit B2. An output unit of the overcurrent detection circuit B2 is connected to a gate of a transistor that constitutes an overcurrent absorption circuit K2. A source of the transistor that constitutes the overcurrent absorption circuit K2 is connected to the ground, and a drain thereof is connected to the non-inversion input unit of the overcurrent detection circuit B2 and the inversion output unit of the operational amplifier circuit A of the amplification circuit 12.

The overcurrent detection circuit B2 and the overcurrent absorption circuit K2 are elements for suppressing an overvoltage that occurs in the output voltage VOUTN of the amplification circuit 12. The overcurrent detection circuit B2 is an element for detecting an overcurrent that occurs in a case where the output voltage VOUTN of the operational amplifier circuit A exceeds the second power source voltage that is supplied to the downstream circuit 13. The overcurrent absorption circuit K2 is an element for absorbing an overcurrent due to the output voltage VOUTN. In a case where the output voltage VOUTN of the operational amplifier circuit A exceeds the clipping voltage VCLP, the overcurrent detection circuit B2 causes the overcurrent due to the output voltage VOUTN to be absorbed in the overcurrent absorption circuit K2 by outputting a high-level signal S to the gate of the transistor that constitutes the overcurrent absorption circuit K2 and causing the transistor to be turned on. Accordingly, an overvoltage of the output voltage VOUTN is limited to the clipping voltage VCLP or below.

Figure 5:
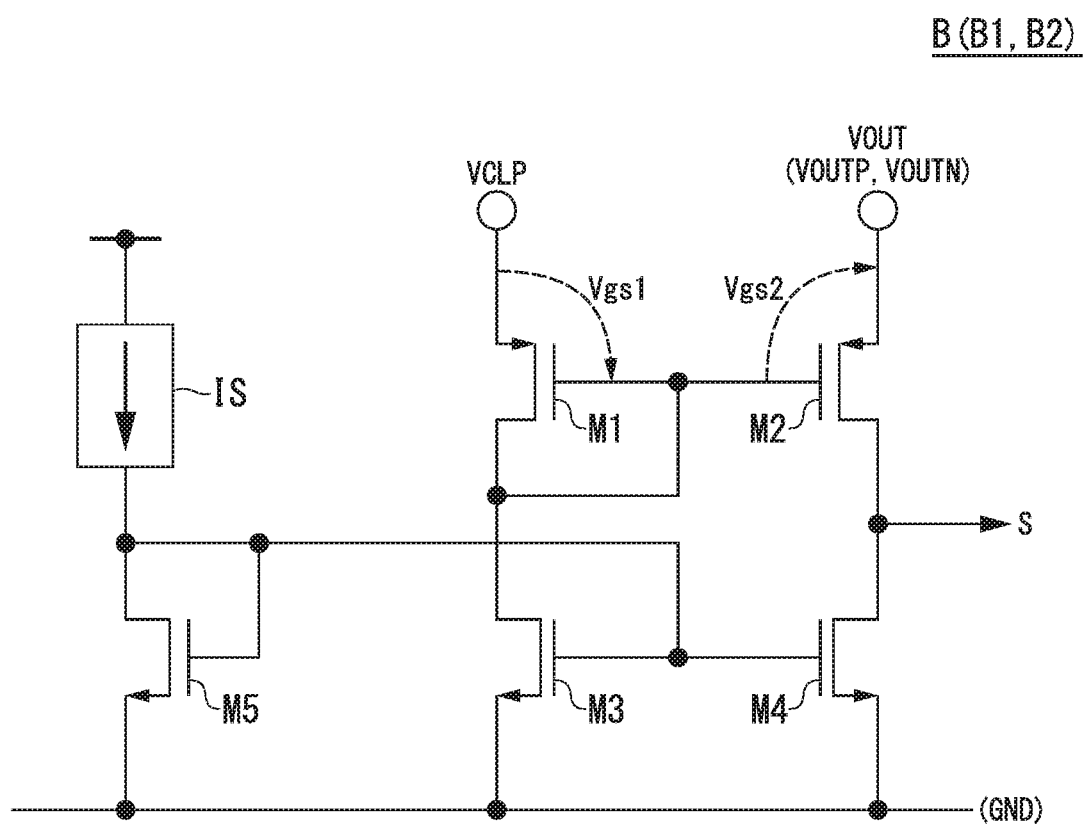
FIG. 5 is a diagram showing an example of a configuration of an overcurrent detection circuit that is included in the semiconductor device according to the second embodiment of the present invention.

FIG. 5 is a diagram showing an example of configurations of the overcurrent detection circuits B1 and B2 that are included in the semiconductor device 20 according to the second embodiment of the present invention. In FIG. 5, an example of one of the configurations of the overcurrent detection circuits B1 and B2 is shown. The overcurrent detection circuits B1 and B2 have the same configuration. An arbitrary one of the overcurrent detection circuits B1 and B2 is hereinafter referred to as an "overcurrent detection circuit B." Furthermore, the overcurrent absorption circuits K1 and K2 have the same configuration, and an arbitrary one of the overcurrent absorption circuits K1 and K2 is referred to as an "overcurrent absorption circuit K."

The overcurrent detection circuit B is configured with a constant current source IS and transistors M1 to M5. Transistors that are used in the overcurrent detection circuit B and the overcurrent absorption circuit K are set to be of the same type as a transistor that is used in the amplification circuit 12, and a size of each transistor is set to be minimized. Accordingly, the electric current consumption is suppressed. Furthermore, the clipping voltage VCLP that is supplied to the overcurrent detection circuit B is set to be approximately the same as the second power source voltage that is supplied to the A/D conversion circuit 100.

Next, an operation of the semiconductor device 20 according to the second embodiment will be described focusing on an operation of the clipping circuit 14.

The overcurrent detection circuit B compares the output voltage VOUT (VOUTP and VOUTN) from the amplification circuit 12 and the clipping voltage VCLP. In a case where the output voltage VOUT (VOUTP and VOUTN) of the amplification circuit 12 exceeds the clipping voltage VCLP, the overcurrent detection circuit B outputs the high-level signal S to the overcurrent absorption circuit K. In this case, the transistor that constitutes the overcurrent absorption circuit K is in an ON state, and the overcurrent absorption circuit K absorbs an overcurrent that flows out from an output terminal of the amplification circuit 12 in such a manner that the output voltage VOUT (VOUTP and VOUTN) of the amplification circuit 12 becomes the clipping voltage VCLP or below.

With reference to FIG. 5, the clipping circuit 14 clips an overvoltage that occurs in the output voltage VOUT of the application circuit 12 according to Equation (4) that follows. In Equation (4), Vout denotes the output voltage VOUT of the amplification circuit 12. Vclip denotes the clipping voltage VCLP, Vgs1 denotes a voltage between gate and source terminals of the transistor M1, and Vgs2 denotes a voltage between gate and source terminals of the transistors M2.

$$Vout = Vclip - Vgs1 + Vgs2 \quad (4)$$

Currents applied to the transistors M1 and M2 from the constant current source IS and the transistors M5 are approximately the same to each other, and the overcurrent that flows out from the output terminal of the amplification circuit 12 is absorbed by the overcurrent absorption circuit K. For this reason, when a voltage Vgs1 between gate and source terminals of the transistor M1 and a voltage Vgs1 between gate and source terminals of the transistor M2 are set to be approximately equal to each other, Equation (5) that follows is obtained from Equation (4) described above.

$$Vout = Vclip \quad (5)$$

As can be understood, from Equation (5) described above, in a case where the output voltage VOUT of the amplification circuit 12 exceeds the clipping voltage VCLP, the output voltage VOUT (Vout) of the amplification circuit 12 is clipped in such a manner as to be approximately equal to the clipping voltage VCLP (Vclip).

On the other hand, in a case where the output voltage VOUT (VOUTP and VOUTN) of the amplification circuit 12 is the clipping voltage VCLP or below, the transistor M2 that is shown in FIG. 5 is caused to maintain the OFF state, and the overcurrent detection circuit B outputs a low-level signal S to the overcurrent absorption circuit K. In this case, the transistor that constitutes the overcurrent absorption circuit K is in the OFF state, and a normal current is not absorbed that flows out from the output terminal of the amplification circuit 12. Therefore, in this case, the clipping circuit 14 neither operates nor exerts an influence on the output voltage VOUT of the amplification circuit 12.

According to the second embodiment, for example, during a period immediately after a power source voltage is applied to the semiconductor device 20 or during other periods of time, in a case where the operation of the semiconductor device 20 is unstable, or in a case where an excessive amount of light is emitted to the pixel array 11, the overvoltage that is caused by the amplification circuit 12 to occur can be suppressed. Therefore, the influence that is exerted on the downstream circuit 13 by the overvoltage that occurs in the output voltage VOUT (VOUTP and VOUTN) of the amplification circuit 12 can be suppressed, and gradual degradation in performance or breakdown due to lack in breakdown voltage of the A/D conversion circuit 100 that constitutes the downstream circuit 13 can be avoided.

Furthermore, according to the second embodiment, because a size of an element that constitutes the clipping circuit 14 can be set to be small, an output load capacity of the amplification circuit 12 can be reduced. For this reason, an output current of the amplification circuit 12 due to the output load capacity of the amplification circuit 12 can be suppressed, and the reduction in power consumption by the amplification circuit 12 can be realized.

(Third Embodiment)

Next, a third embodiment of the present invention will be described.

In the third embodiment, a successive approximation type A/D conversion circuit is used as the A/D conversion circuit 100 in the first embodiment and the second embodiment. The others are the same as in the first embodiment and the second embodiment. The A/D conversion circuit 100 that is shown in FIG. 1 is hereinafter referred to as a "successive approximation type A/D conversion circuit 100."

Figure 6:
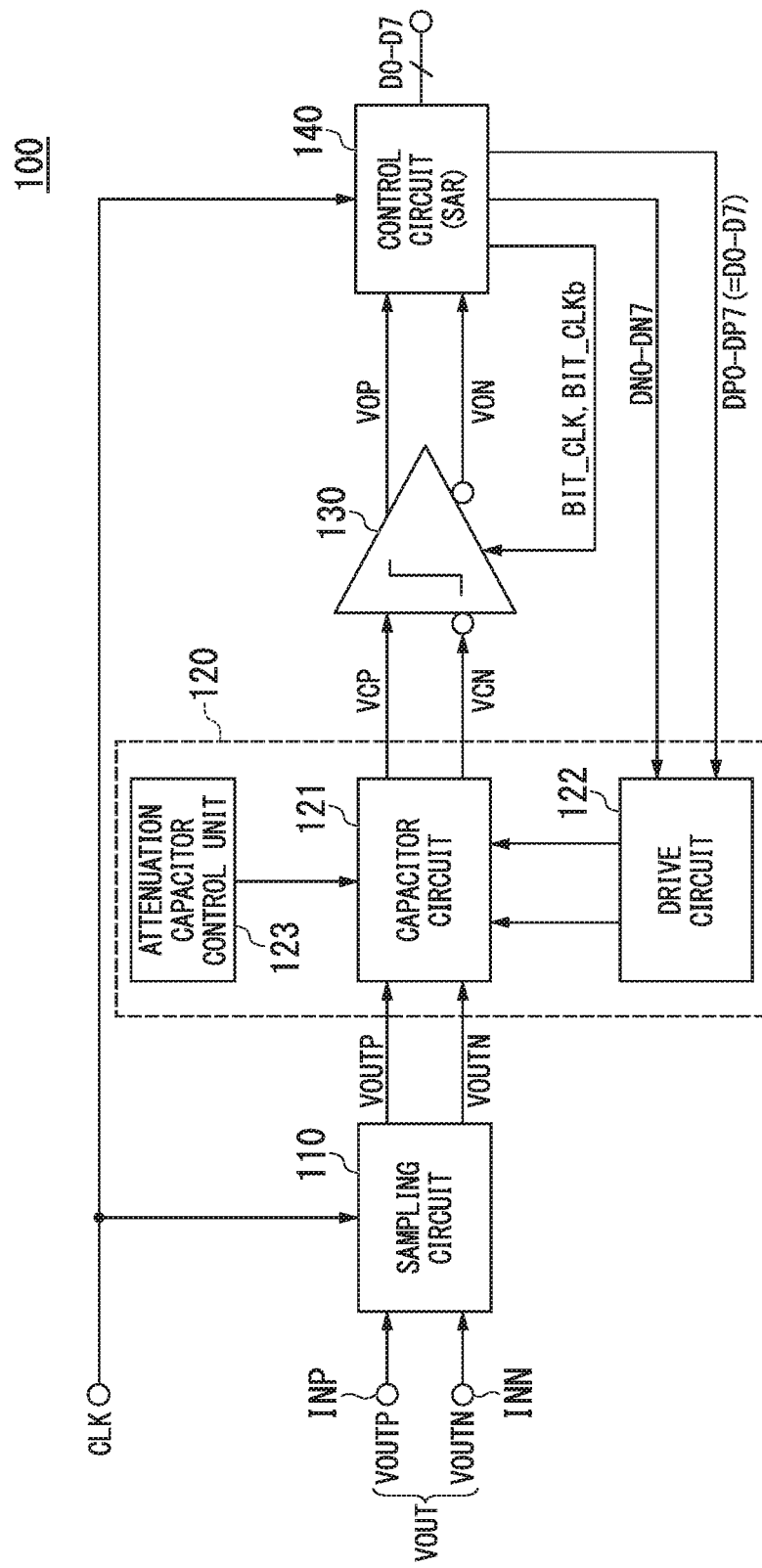
FIG. 6 is a block diagram showing an example of a configuration of a successive approximation type A/D conversion circuit that is included in a semiconductor device according to a third embodiment of the present invention.

FIG. 6 is a block diagram showing an example of a configuration of the successive approximation type A/D conversion circuit 100 that is included in a semiconductor device according to the third embodiment of the present invention.

The successive approximation type A/D conversion circuit 100 is an A/D conversion circuit 8-bit output, but without being limited to this example, the number of bits that are output by the successive approximation type A/D conversion circuit 100 can be arbitrarily set.

The successive approximation type A/D conversion circuit 100 includes a sampling circuit 110, a capacitive DAC circuit 120, a comparison circuit 130, and a control circuit 140.

The sampling circuit 110 is an element for performing tracking and holding of a pair of output voltages VOUTP and VOUTN that constitutes the output voltage VOUT (a differential input signal) of the amplification circuit 12, and for performing the sampling on analog signals VAP and VAN and taking the analog signals VAP and VAN in the successive approximation type A/D conversion circuit 100. An operation of the sampling circuit 110 is controlled on the basis of a clock signal CLK.

The capacitive DAC circuit 120 is an element for generating a reference signal that is based on digital signals (D0 to D7) which are generated by the control circuit 140, subtracting the reference signal from each of the output voltages VOUTP and VOUTN which are held by the sampling circuit 110 and on which the sampling is performed by the sampling circuit 110, and thus obtaining an accumulation residual between a differential input signal VA and each of the 8-bit digital signals D0 to D7. The differential input signal VA is a signal of which elements are the output voltages VOUTP and VOUTN. The capacitive DAC circuit 120 outputs a subtraction result that is obtained by subtracting the reference signal from each of the output voltages VOUTP and VOUTN, as analog signals VCP and VCN in which the accumulation residual is reflected, to the comparison circuit 130.

The comparison circuit 130 is an element for comparing the analog signal VCP and the analog signal VCN that are input from the capacitive DAC circuit 120, and outputs digital signals VOP and VON representing a result of the comparison in accordance with magnitude correlation. More specifically, in a case where a signal level of the analog signal VCP is higher than a signal level of the analog signal VCN, the comparison circuit 130 outputs a high-level signal as the digital signal VOP, and outputs a low-level signal as the digital signal VON. Conversely, in a case where the signal level of the analog signal VCP is lower than the signal level of the analog signal VCN, the comparison circuit 130 outputs a low-level signal as the digital signal VOP, and outputs a high-level signal as the digital signal VON. An operation of the comparison circuit 130 is controlled on the basis of an internal clock signal BIT_CLK and an inversion internal clock signal BIT_CLKb that are generated in the control circuit 140 that will be described below.

The control circuit 140 is an element that functions as a successive approximation register (SAR) logic circuit, and according to a binary search algorithm, sequentially determines a value of a bit of each of the digital signals DP0 to DP7 and DN0 to DN7 that correspond to the digital signals VOP and VON indicating the result of the comparison by the comparison circuit 130. The control circuit 140 supplies the digital signals DP0 to DP7 and DN0 to DN7 that correspond to the digital signals VOP and VON, to the capacitive DAC circuit 120. By doing this, the control circuit 140 causes the value of the bit of each of the digital signals DP0 to DP7 and DN0 to DN7 to be reflected in the reference signal. The control circuit 140 outputs the digital signals DP0 to DP7 as the digital signals D0 to D7, respectively, that represent the result of the A/D conversion. Furthermore, the control circuit 140 generates the internal clock signal BIT_CLK and the inversion internal clock signal BIT_CLKb that control the comparison circuit 130, and supplies the generated signals to the comparison circuit 130. An operation of the control circuit 140 is controlled on the basis of the clock signal CLK. The control circuit 140 generates the internal clock signal BIT_CLK and the inversion internal clock signal BIT_CLKb during a period when the clock signal CLK is at the high level.

The capacitive DAC circuit 120 includes a capacitor circuit 121, a drive circuit 122, and an attenuation capacitor control unit 123. The capacitor circuit 121 is an element for using electric charge redistribution among multiple capacitors and thus subtracting the reference signal from the output voltages VOUTP and VOUTN and obtaining the analog signals VCP and VCN representing the accumulation residual described above. The drive circuit 122 is an element for generating the reference signal described above on the basis of the digital signals DP0 to DP7 and DN0 to DN7 that are input from the control circuit 140 and thus driving the capacitor circuit 121. The attenuation capacitor control unit 123 is an element for controlling capacitance values of attenuation capacitors CHP and CHN that are included in the capacitor circuit 121, which will be described below.

The successive approximation type A/D conversion circuit 100 obtains the result of the A/D conversion for one bit at a time in the direction from the most significant bit (D7) of each of the digital signals D0 to D7 to the least significant bit (D0). In this process of the A/D conversion, each time the subtraction described above is performed by the capacitor circuit 121 of the capacitive DAC circuit 120, the comparison circuit 130 compares voltages of the analog signal VCP and the analog signal VCN in which the accumulation residual up to that time is reflected.

Figure 7:
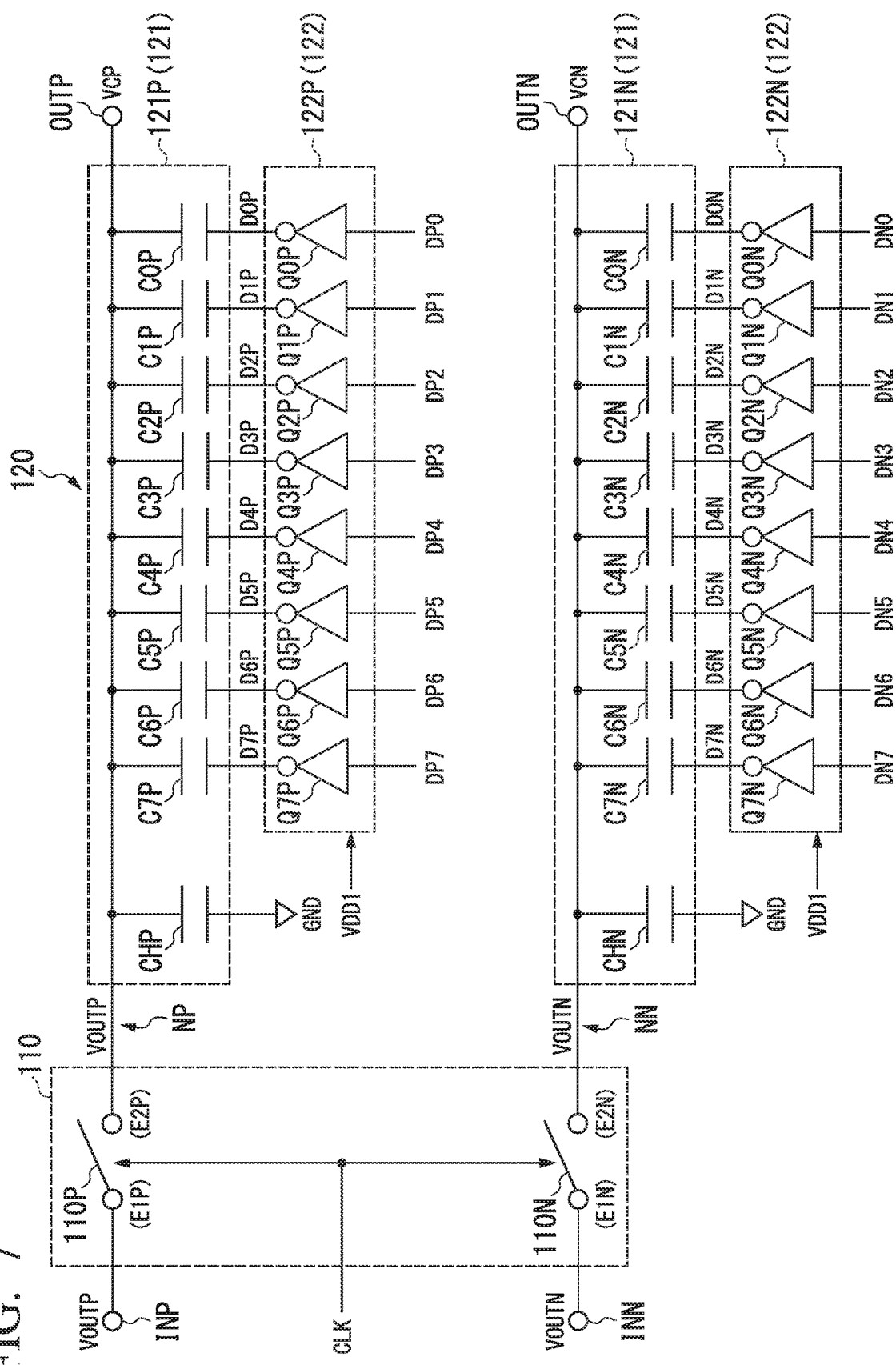
FIG. 7 is a circuit diagram showing an example of configurations of a sampling circuit and a capacitive DAC circuit that are included in the successive approximation type A/D conversion circuit according to the third embodiment of the present invention.

FIG. 7 shows an example of configurations of the sampling circuit 110 and the capacitive DAC circuit 120. In FIG. 7, the attenuation capacitor control unit 123 that is a constituent element of the capacitive DAC circuit 120, which is shown in FIG. 6, is omitted.

The sampling circuit 110 includes switches 110P and 110N. The switch 110P causes a first terminal E1P and a second terminal E2P to electrically conduct each other when the switch 110P is in an ON state and sets a state between the first terminal E1P and the second terminal E2P to a high impedance state when the switch 110P is in an OFF state. The output voltage VOUTP of the amplification circuit 12 is input into the first terminal E1P of the switch 110P through a non-inversion input terminal INP. The moment the transitioning from the ON state to the OFF state takes place, the switch 110P holds the output voltage VOUTP in a capacitor unit 121P that will be described below, and performs the sampling on the output voltage VOUTP. The switch 110P is switched between ON and OFF states on the basis of the clock signal CLK.

The switch 110N causes a first terminal E1N and a second terminal E2N to electrically conduct each other when the switch 110N is in an ON state and sets a state between the first terminal E1N and the second terminal E2N to a high impedance state when the switch 110N is in an OFF state. The output voltage VOUTN of the amplification circuit 12 is input into the first terminal E1N of the switch 110N through an inversion input terminal INN. The moment the transitioning from the ON state to the OFF state takes place, the switch 110N holds the output voltage VOUTN in a capacitor unit 121N that will be described below, and performs the sampling on the output voltage VOUTN. The switch 110N is switched between ON and OFF states on the basis of the clock signal CLK.

The capacitor circuit 121 that constitutes the capacitive DAC circuit 120 is configured with the capacitor units 121P and 121N. Of these, the capacitor unit 121P includes an attenuation capacitor CHP and binary capacitors C0P to C7P. The attenuation capacitor CHP is connected between a signal node NP that is corresponding to a wiring which is connected to the second terminal E2P of the switch 110P, and a ground GND. Furthermore, each of the binary capacitors C0P to C7P is connected between the signal node NP described above and an output unit of a drive unit 122P that constitutes the drive circuit 122. That is, a first electrode that is included in each of the binary capacitors C0P to C7P is connected to the signal node NP, in a manner that shares the signal node NP. Furthermore, a second electrode that is included in each of the binary capacitors C0P to C7P is connected to one of output units of inverters Q0P to Q7P that constitute the drive circuit 122.

The binary capacitors C0P to C7P are arranged in a manner that corresponds to digital signals DP0 to DP7, respectively, that are generated by the control circuit 140. The binary capacitors C0P to C7P have their respective different capacitance values. For example, a capacitance value of a capacitor C(n+1)P that corresponds to a digital signal DP(n+1) is two times a capacitance value of a capacitor CnP that corresponds to a digital signal DPn (n is an integer that ranges from 0 to 6). That is, the capacitance value of each of the binary capacitors C0P to C7P is weighted by a binary number in accordance with a position of the bit of each of the digital signals DP1 to DP7.

In the same manner, the capacitor unit 121N includes an attenuation capacitor CHN and binary capacitors C0N to C7N. The attenuation capacitor CHN is connected between a signal node NN that is corresponding to a wiring which is connected to the second terminal E2N of the switch 110N, and the ground GND. Furthermore, each of the binary capacitors C0N to C7N is connected between the signal node NN described above and an output unit of a drive unit 122N that constitutes the drive circuit 122. That is, a first electrode that is included in each of the binary capacitors C0N to C7N is connected to the signal node NN, in a manner that shares the signal node NN. Furthermore, a second electrode that is included in each of the binary capacitors C0N to C7N is connected to one of output units of inverters Q0N to Q7N that constitute the drive unit 122N.

It should be noted that capacitance values of the binary capacitors C0N to C7N are also weighted by a binary number in the same manner as the binary capacitors C0P to C7P.

Furthermore, each of the capacitance values of the binary capacitors C0N to C7N that constitute the capacitor 121N is set in the same manner as each of the capacitance values of the binary capacitors C0P to C7P that constitute the capacitor unit 121P.

The drive circuit 122 that constitutes the capacitive DAC circuit 120 includes the drive units 122P and 122N. The drive unit 122P includes the inverters Q0P to Q7P. A first power source voltage VDD1 is supplied to the inverters Q0P to Q7P as a power source voltage. This means that amplitudes of reference signals D0P to D7P that are output from the inverters Q0P to Q7P, respectively, are corresponding to the first power source voltage VDD1. The Inverters Q0P to Q7P are arranged in a manner that corresponds to the digital signals DP0 to DP7, respectively, that are generated by the control circuit 140. The bits of the digital signals DP0 to DP7 are input from the control circuit 140 into the inverters Q0P to Q7P, respectively. Furthermore, output units of inverters QP0 to QP7 are connected to the second electrodes of the binary capacitors C0P to C7P, respectively.

The inverters QP0 to QP7 invert the digital signals DP0 to DP7, respectively, that are input from the control circuit 140, and thus generate the reference signals D0P to D7P, respectively. Multiple binary capacitors C0P to C7P that are included in the capacitor unit 121P extract electric charges that are based on the reference signals D0P to D7R, respectively, from an electric charge that is based on the output voltage VOUTP of the amplification circuit 12, which is held in the attenuation capacitor CHP, by performing the electric charge redistribution, and thus subtract the reference signals D0P to D7P, respectively, from the output voltage VOUTP. The capacitor unit 121P outputs the analog signal VCP that is a result of the subtraction.

In the same manner, the drive unit 122N includes the inverters Q0N to Q7N. The first power source voltage VDD1 is supplied to the inverters Q0N to Q7N as a power source voltage. This means that amplitudes of reference signals D0N to D7N that are output from the inverters Q0N to Q7N, respectively, are corresponding to the first power source voltage VDD1. The inverters Q0N to Q7N are arranged in a manner that corresponds to the digital signals DN0 to DN7, respectively, that are generated by the control circuit 140. The bits of the digital signals DN0 to DN7 are input from the control circuit 140 into the inverters Q0N to Q7N, respectively. Furthermore, the output units of the inverters Q0N to Q7N are connected to the second electrodes of the binary capacitor C0N to C7N, respectively.

Inverters QN0 to QN7 invert the digital signals DN0 to DN7, respectively, that are input from the control circuit 140, and thus generates the reference signal D0N to D7N, respectively. Multiple binary capacitors C0N to C7N that are included in the capacitor unit 121N extract electric charge that are based on the reference signals D0N to D7N, respectively, from an electric charge that is based on the output voltage VOUTN of the amplification circuit 12, which is held in the attenuation capacitor CHN, by performing the electric charge redistribution, and thus subtract the reference signals D0N to D7N, respectively, from the analog signal VAN. The capacitor unit 121N outputs the output voltage VOUTN that is a result of the subtraction.

Figure 8:
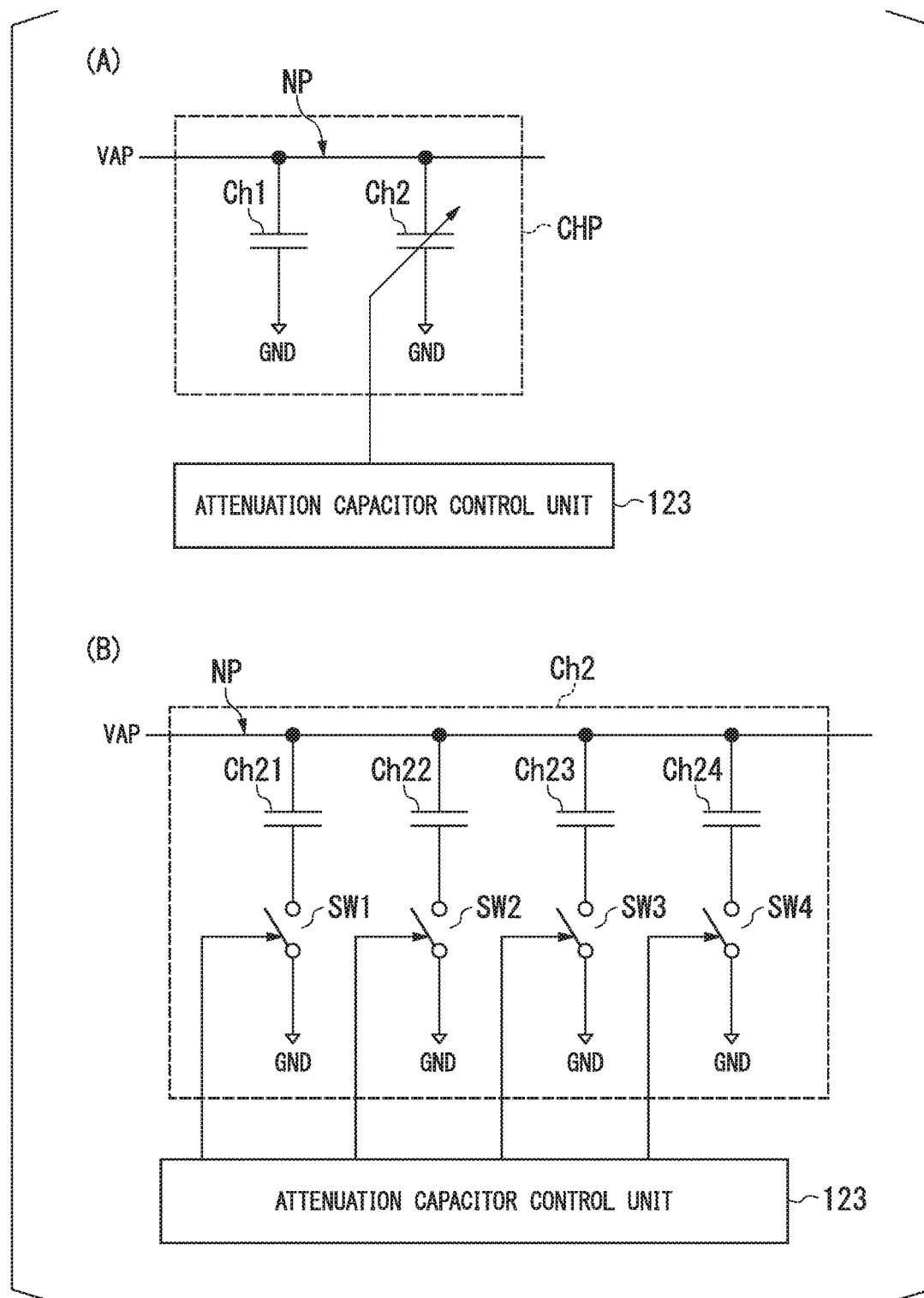
FIG. 8 is a diagram showing an example of a configuration of an attenuation capacitor that is included in the successive approximation type A/D conversion circuit according to the third embodiment of the present invention. (A) of FIG. 8 is a schematic diagram and (B) of FIG. 8 is a detailed diagram.

FIG. 8 is a diagram showing an example of a configuration of the attenuation capacitor CHP that is included in the successive approximation type A/D conversion circuit 100 according to the third embodiment of the present invention (A) of FIG. 8 is a schematic diagram of the attenuation capacitor CHP, and (B) of FIG. 8 is a detailed diagram of the attenuation capacitor CHP. The attenuation capacitor CHN is the same as the attenuation capacitor CHP, and thus a description thereof is omitted here.

As shown in (A) of FIG. 8, the attenuation capacitor CHP includes a fixed capacitor Ch1 and a variable capacitor Ch2. A first electrode of the fixed capacitor Ch1 is connected to the signal node NP, and a second electrode of the fixed capacitor Ch1 is connected to the ground GND (a predetermined electric potential node). Furthermore, a first electrode of the variable capacitor Ch2 is connected to the signal node NP, and a second electrode of the variable capacitor Ch2 is connected to the ground GND. That is, the fixed capacitor Ch1 and the variable capacitor Ch2 are connected in parallel between the signal node NP and the ground GND.

As shown in (B) of FIG. 8, the variable capacitor Ch2 includes capacitors Ch21, Ch22, Ch23, and Ch24 and switches SW1, SW2, SW3, and SW4. The capacitor Ch21 is connected in series to the switch SW1 between the signal node NP and the ground GND. More specifically, a first electrode of the capacitor Ch21 is connected to the signal node NP, and a second electrode of the capacitor Ch21 is connected to a first terminal of the switch SW1. A second terminal of the switch SW1 is connected to the ground GND.

In the same manner, the capacitor Ch22 is connected in series to the switch SW2 between the signal node NP and the ground GND. The capacitor Ch23 is connected in series to the switch SW3 between the signal node NP and the ground GND. The capacitor Ch24 is connected in series to the switch SW4 between the signal node NP and the ground GND.

It should be noted that a connection relationship between each of the capacitors Ch21 to Ch24 and each of the switches SW1 to S4 may be expressed in terms of an in-series connection, and that positions of the capacitors Ch21 to Ch24 and positions of the switches SW1 to SW4 may be interchanged.

Each of the on/off state of the SW1, SW2, SW3, and SW4 is individually controlled by the attenuation capacitor control unit 123. A capacitance value of the variable capacitor Ch2 is determined according to combinations of the on/off state of the switches SW1, SW2, SW3, and SW4. As shown in (A) of FIG. 8, because the variable capacitor Ch2 is connected in parallel to the fixed capacitor Ch1, a composite capacitance value of the attenuation capacitor CHP that is configured with the fixed capacitor Ch1 and the variable capacitor Ch2 can be adjusted by controlling the operations of turning on and off the switches SW1, SW2, SW3, and SW4. Adjustment of a composite capacitance of the attenuation capacitor CHP will be described in detail below.

Next operation (A/D conversion) of the successive approximation type A/D conversion circuit 100 will be described with reference to a timing chart in FIG. 9.

In a case where the clock signal CLK is at a low level, the sampling circuit 110 that is included in the successive approximation type A/D conversion circuit 100 tracks and performs the sampling on the analog signal VAP and the analog signal VAN that are input as the differential input signal VA, and holds the analog signal VAP and the analog signal VAN at a timing when the clock signal CLK transits from the low level to the high level.

Because the analog signal VAP and the analog signal VAN are tracked and sampled during a period when the clock signal CLK is at the low level, this period when the clock signal is at a low level is hereinafter referred to as a sampling period. Furthermore, because the analog signal VAP and the analog signal VAN are held during a period when the clock signal CLK is at a high level, this period when the clock CLK is at the high level is referred to as a holding period.

As will be described next, during the holding period, the successive approximation type A/D conversion circuit 100 performs conversion of the analog signals VAP and VAN on which the sampling is performed in the sampling circuit 110 during the sampling period. The successive approximation type A/D conversion circuit 100 sequentially determines a value of the bit of each of the digital signals D0 to D7 in the direction from the most significant bit (D7) to the least significant bit (D0), according to clock timings of the internal clock, signal BIT_CLK and the inversion internal clock signal BIT_CLKb that are input from the control circuit 140 during the holding period. Accordingly, the successive approximation type A/D conversion circuit 100 performs the A/D conversion of the analog signals VAP and VAN that are held in the sampling circuit 110 and generates the digital signals D0 to D7.

The A/D conversion by the successive approximation type A/D conversion circuit 100 will be described in detail.

The clock signal CLK is at the low level during the sampling period before a time t0 in the timing chart in FIG. 6. For this reason, the switches 110P and 110N of the sampling circuit 110 are in the ON state. In this case, the sampling circuit 110 performs the sampling on (tracks) the analog signals VAP and VAN, and the analog signals VAP and VAN, on which the sampling is performed, are supplied to the capacitive DAC circuit 120. The attenuation capacitors CHP and CHN and the binary capacitors C0P to C7P and C0N to C7N of the capacitive DAC circuit 120 are charged with an electric charge that corresponds to electric potentials of the analog signal VAP and the analog signal VAN that are supplied from the sampling circuit 110.

It should be noted that during the sampling period, the bit of each of the digital signals DP0 to DP7 and DN0 to DN7 that are output from the control circuit 140 is set (initialized) to "0".

At the time t0, when the clock signal CLK transitions from the low level to the high level and the holding period starts, the switches 110P and 110N of the sampling circuit 110 are in the OFF state. For this reason, the analog signals VAP and VAN that are present immediately before the clock signal CLK transitions from the low level to the high level are held in the attenuation capacitors CHP and CHN and the binary capacitors C0P to C7P and C0N to C7N of the capacitor circuit 121 that is included in the capacitive DAC circuit 120. The analog signals VAP and VAN that are held are supplied as the analog signals VCP and VCN, respectively, from the capacitive DAC circuit 120 to the comparison circuit 130.

As will be described next, under the control of the control circuit 140, the comparison circuit 130 sequentially compares the analog signals VCP and the analog signal VCN that are supplied from the capacitive DAC circuit 120.

First, an operation during the period T1 from the time t1 to the time t2, which is corresponding to an initial cycle of the internal clock signal BIT_CLK after the time t0, will be described.

In a state where the analog signals VAP and VAN are held in the sampling circuit 110 and are output, as the analog signals VCP and VCN, respectively, from the capacitive DAC circuit 120, when the internal clock signal BIT_CLK transitions from the low level to the high level at the time t1, a latch circuit of the comparison circuit 130 is active and the comparison circuit 130 starts an operation of comparing the analog signal VCP and the analog signal VCN.

In an example in FIG. 6, because at the time t1 the signal level of the analog signal VCP is higher than the signal level of the analog signal VCN (VCP>VCN), the comparison circuit 130 outputs the high-level digital signal VOP, and outputs the low-level digital signal VON. The control circuit 140 receives the above-described result of the comparison by the comparison circuit 130, and outputs a high-level digital signal DP7 and a low-level digital signal DN7. Accordingly, among the bits of the digital signals D0 to D7 that are obtained by the A/D conversion, a value of the most significant bit (D7) that is given by the digital signals DP7 and DN7 is determined.

When the digital signal DP7 transitions from the low level to the high level, an output signal (a reference signal) of the inverter Q7P of the drive unit 122P (FIG. 7) into which the digital signal DP7 is input transitions from the high level to the low level, and a voltage changes between electrodes of the binary capacitor C7P, to which the output signal of the inverter Q7P is applied. For this reason, according to an amount of change in the voltage between the electrodes of the binary capacitor C7P, electric charges that are accumulated in the binary capacitor C7P are extracted and the electric charge redistribution is performed. As a result, an electric potential of the signal node NP (FIG. 7) within the capacitive DAC circuit 120, to which the attenuation capacitor CHP and the binary capacitors C0P to C7P are connected in a manner that shares the signal node NP, is decreased to an electric potential that corresponds to the electric charge which is extracted from the binary capacitor C7P using the electric charge redistribution. For this reason, the signal level of the analog signal VCP that is given by an electric potential of the signal node NP is decreased.

On the other hand, because the digital signal DN7 is maintained at the low level, an output signal (a reference signal) of an inverter Q7N of the drive unit 122N into which the digital signal DN7 is input is maintained at the high level. For this reason, because there is no movement of an electric charge of a binary capacitor C7N to which the output signal of the inverter Q7N is applied, an electric potential of a signal node NN (FIG. 7) within the capacitive DAC circuit 120, to which the attenuation capacitor CHN and the binary capacitors C0N to C7N are connected in a manner that shares the signal node NN is not changed. For this reason, the signal level of the analog signal VCN that is given by an electric potential of the signal node NN is not changed.

At a time t1a, when the internal clock signal BIT_CLK becomes at the low level and the inversion internal clock signal BIT_CLKb becomes at the high level, the latch circuit of the comparison circuit 130 becomes inactive. In this case, the comparison circuit 130 outputs both of the digital signals VOP and VON as low-level signals.

Next, an operation during the period T2 from the time t2 to the time t3, which is corresponding to the second cycle of the internal clock signal BIT_CLK, will be described.

In a state where the analog signals VAP and VAN are held in the sampling circuit 110 and are output, as the analog signals VCP and VCN, respectively, from the capacitive DAC circuit 120, when at the time t2, the internal clock signal BIT_CLK transitions from the low level to the high level and the inversion internal clock signal BIT_CLKb becomes at the low level, the latch circuit of the comparison circuit 130 becomes active and the comparison circuit 130 starts the operation of comparing the analog signal VCP and the analog signal VCN that are supplied from the capacitive DAC circuit 120.

Figure 9:
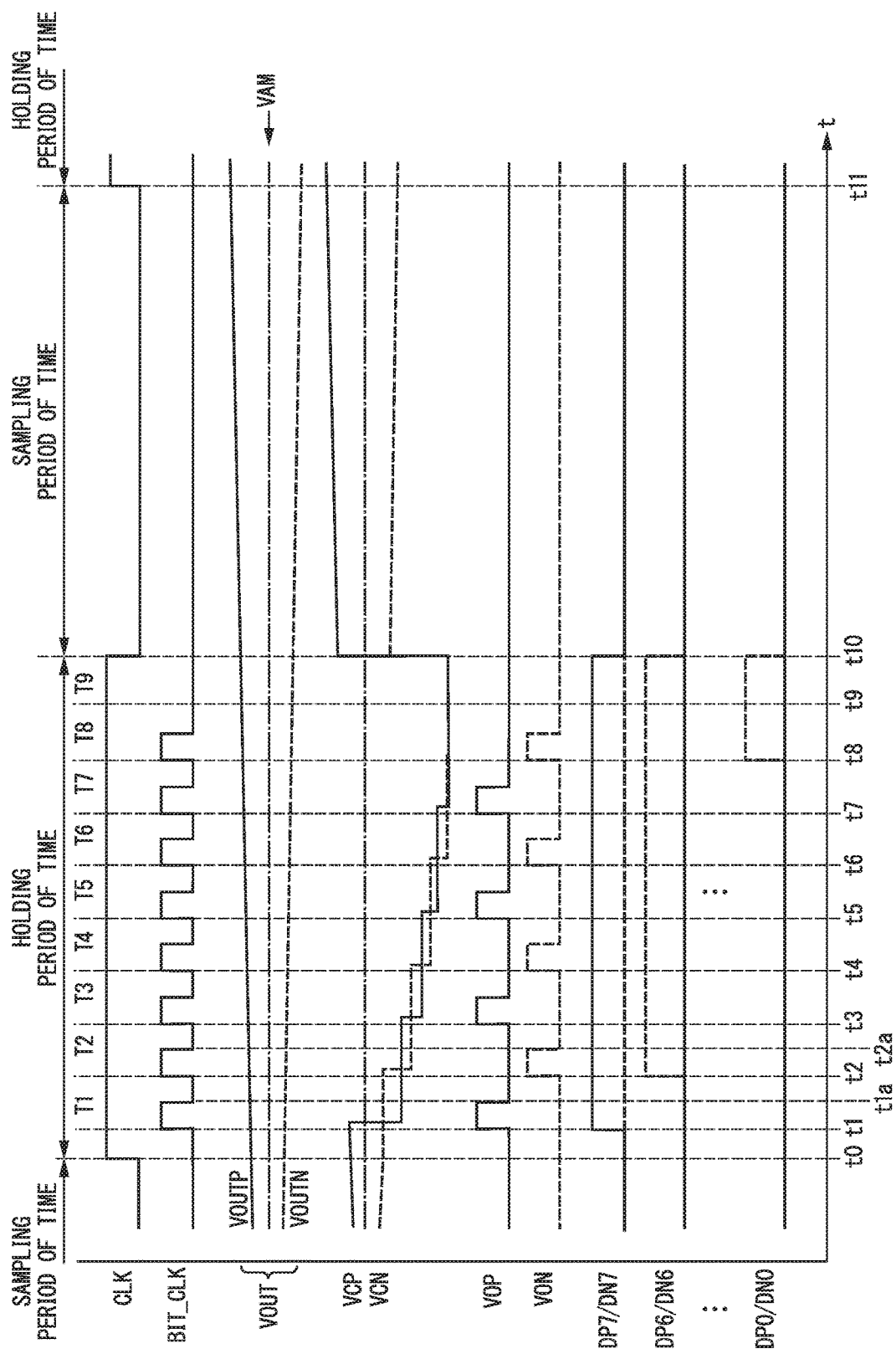
FIG. 9 is a timing chart showing an example of an operation of the successive approximation type A/D conversion circuit according to the third embodiment of the present invention.

In the example in FIG. 9, because at the time t2, the signal level of the analog signal VCP is lower than the signal level of the analog signal VCN (VCP<VCN), the comparison circuit 130 outputs the low-level digital signal VOP, and outputs the high-level digital signal VON. The control circuit 140 receives the above-described result of the comparison by the comparison circuit 130, and outputs a low-level digital signal DP6 and a high-level digital signal DN6. Accordingly, among the bits of the digital signal D0 to D7 that are obtained by the A/D conversion, a value of the second bit (D6) from the most significant position, which is given by the digital signals DP6 and DN6 is determined.

Because the digital signal DP6 is maintained at the low level, an output signal (a reference signal) of the inverter Q6P of the drive unit 122P into which the digital signal DP6 is input is maintained at the high level. For this reason, because there is no movement of an electric charge of a binary capacitor C6P to which the output signal of the inverter Q6P is applied, the electric potential of the signal node NP (FIG. 7) within the capacitive DAC circuit 120, to which the attenuation capacitor CHP and the binary capacitors C0P to C7P are connected in a manner that shares the signal node NP is not changed. For this reason, the signal level of the analog signal VCP that is given by an electric potential of the signal node NP is not changed.

On the other hand, when the digital signal DN6 transitions from the low level to the high level, an output signal (a reference signal) of the inverter Q6N of the drive unit 122N (FIG. 7) into which the digital signal DN6 is input transitions from the high level to the low level, and a voltage changes between electrodes of the binary capacitor C6N, to which the output signal of the inverter Q6N is applied. For this reason, according to an amount of change in the voltage between the electrodes of the binary capacitor C6N, electric charges that are accumulated in the binary capacitor C6N are extracted and the electric charge redistribution is performed. As a result, an electric potential of the signal node NN (FIG. 7) within the capacitive DAC circuit 120, to which the attenuation capacitor CHN and the binary capacitors C0N to C7N are connected in a manner that shares the signal node NN, is decreased to an electric potential that corresponds to the electric charge which is extracted from the binary capacitor C6N using the electric charge redistribution. For this reason, the signal level of the analog signal VCN that is given by an electric potential of the signal node NN is decreased.

Subsequently, at a time t2a, when the internal clock signal BIT_CLK becomes at the low level and the inversion internal clock signal BIT_CLKb becomes at the high level, the latch circuit of the comparison circuit 130 becomes inactive. In this case, the comparison circuit 130 outputs both of the digital signals VOP and VON as low-level signals.

Subsequently, during periods T3 to T8 after the time t3, a comparing operation that is the same as the comparing operation during each of periods T1 and T2 described above is sequentially repeated (that is, a sequential comparison is performed), and values of the bits are determined starting from the third bit (D5) of the digital signals D0 to D7 to the least significant bit (D0). Accordingly, the digital signals D0 to D7, all values of whose bits are determined by the A/D conversion, are obtained.

Subsequently, during a period T9, the control circuit 140 of the successive approximation type A/D conversion circuit 100 outputs the digital signals D0 to D7, which are finally obtained by the A/D conversion described above, from the output terminal.

Subsequently, at a time t10, when the clock signal CLK transitions from the high level to the low level, the switch 110P and the switch 110N of the sampling circuit 110 become in the ON state. Accordingly, during the sampling period from the time t10 to a time t11 when the clock signal CLK is maintained at the low level, the sampling circuit 110 newly performs the sampling on (tracks) the analog signal VAP and the analog signal VAN.

Then, the attenuation capacitors CHP and CHN and the binary capacitors C0P to C7P and C0N to C7N of the capacitive DAC circuit 120 are charged with an electric charge that corresponds to the analog signals VAP and VAN on which the sampling is newly performed. Furthermore, in the control circuit 140, the bit of each of the digital signals DP0 to DP7 and D0 to DN7 is set (initialized) to "0." Thereafter, in the same manner as the A/D conversion during the holding period horn the time t1 to the time t10 in FIG. 6 described above, the A/D conversion is performed using the sequential comparison in the holding period after the time t11.

Next, a technique for securing a full-scale range of each of the digital signals VP0 to VP7, which is a feature of the present embodiment, will be described in detail.

For easy understanding, the equation the first power source voltage VDD1=the second power source voltage VDD2=the power source voltage VDD is assumed.

In the present embodiment, as will be described next, it is possible that the full-scale range of each of the digital signals VP0 to VP7, which are obtained by the A/D conversion described above, is adjusted by the attenuation capacitors CHP and CHN.

Figure 10:
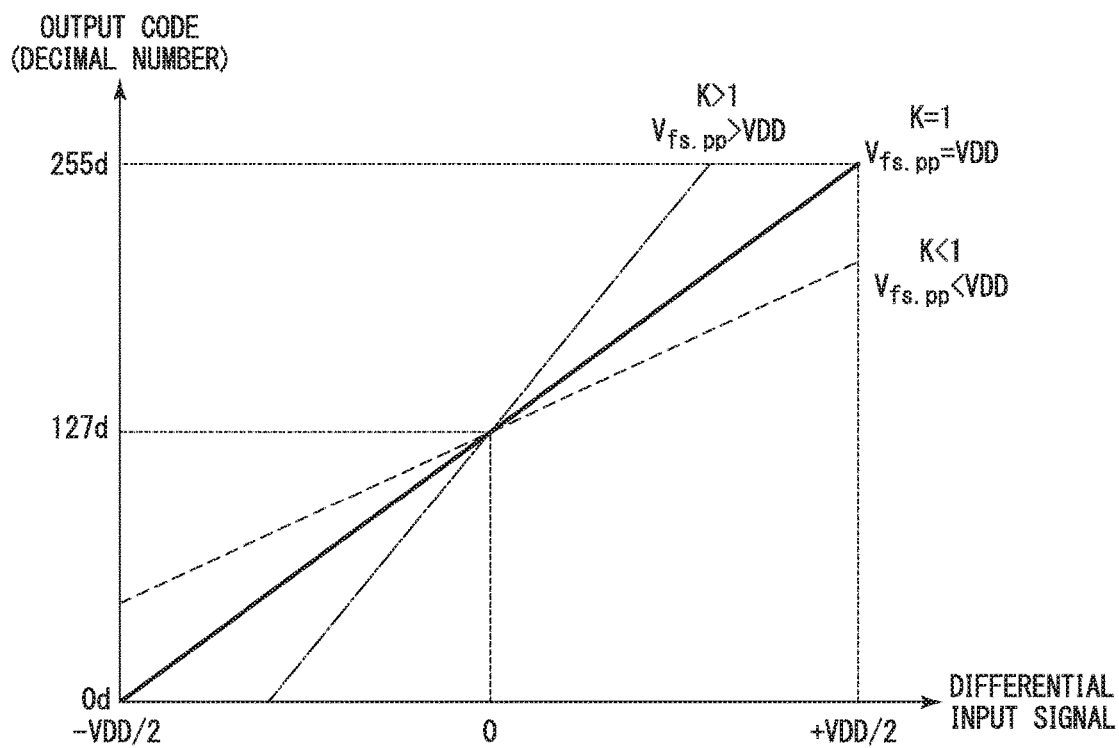
FIG. 10 is a diagram describing the principle behind adjustment of a capacitance value of a variable capacitor that constitutes the attenuation capacitor of the successive approximation type A/D conversion circuit according to the third embodiment of the present invention.

The principle behind the adjustment of the capacitance value of the variable capacitor Ch2 will be described with reference to FIG. 10 that is a characteristic diagram. FIG. 10 is a diagram describing the principle behind the adjustment of the capacitance value of the variable capacitor Ch2 that constitutes the attenuation capacitor CHP of the successive approximation type A/D conversion circuit 100 according to the first embodiment of the present invention, and is a diagram showing input and output characteristics of the successive approximation type A/D conversion circuit 100.

The successive approximation type A/D conversion circuit 100 is a full differential-type device. A phase of an AC component of the output voltage VOUTP of the amplification circuit 12, which constitutes the differential input signal that is input into the inversion input terminal INN and the non-inversion input terminal INP, and a phase of an AC component of the output voltage VOUTN have a relationship in which phases are inverted with respect to each other, and has a relationship in which one phase is shifted by 180 degrees with respect to the other phase. For this reason, in a case where the output voltage VOUT of the amplification circuit 12 which constitutes the differential input signal is 0 V, that is, in a case where a difference in voltage between the output voltage VOUTP and the output voltage VOUTN is 0 V, each of the output voltages VOUP and VOUTN becomes a reference point (a center point) of an input voltage in the A/D conversion operation.

Therefore, in a case where the successive approximation type A/D conversion circuit 100 for 8 bits performs an ideal operation, that is, in a case where a capacitance value of the attenuation capacitor CHP is correctly adjusted, (k=1), as shown by a solid line in FIG. 10, the input and output characteristics of the successive approximation type A/D conversion circuit 100 are indicated by a straight line that passes through coordinates (~VDD/2, 0), coordinates (0 V, 127d), and coordinates (+VDD/2, 255d), in which case the full-scale range is obtained. This means that a full-scale output code (0d to 255d) is obtained, as the digital signal that is obtained by the A/D conversion, with respect to a full range (~VDD/2 to +VDD/2) of the differential input signal VA.

Therefore, in the case of the ideal characteristics that are shown by a solid line in FIG. 10 (k=1), the following relationship is established between the output voltage VOUT of the amplification circuit 12, which constitutes the differential input signal and the output code (a post-conversion digital signal).

(1) In a case where the output voltage VOUT (the differential input signal) is 0 V, the output code is 127d (an intermediate value).

(2) In a case where the output voltage VOUT (the differential input signal) is ~VDD/2V, the output code is 0d.

(3) In a case where the output voltage VOUT (the differential input signal) is +VDD/2V, the output code is 255d.

In contrast, in a case where the capacitance value of the attenuation capacitor CHP is not correctly adjusted (in a case where k is not 1), a slope of a straight line indicating the input and output characteristics of the successive approximation type A/D conversion circuit 100 changes about coordinates (0 V, 127d) that corresponds to the reference point and serves as an axis. In an example in FIG. 10, as indicated by a dashed line, in a case where k is greater than 1 (k>1), this shows the tendency for the straight line indicating the input and output characteristics of the successive approximation type A/D conversion circuit 100 to increase in slope in comparison with a case where k=1. Conversely, in a case where k is smaller than 1 (k<1), as shown by a broken line, this shows the tendency for the straight line indicating the input and output characteristics of the successive approximation type A/D conversion circuit 100 to decrease in slope in comparison with the case where k=1.

If the characteristics described above are used, it is possible that by inputting already-known output voltages VOUTP and VOUTN other than 0 V that provides the reference point, as the output voltage VOUT (the differential input signal) of the amplification circuit 12, into the successive approximation type A/D conversion circuit 100, and by referring to magnitude correlation between a value of the output code that is obtained in such a case and a target code that is represented by the characteristics which are indicated by a solid line in FIG. 10, the capacitance value of the variable capacitor Ch2 of the attenuation capacitor CHP is adjusted in such a manner that k=1 is satisfied, and the variable capacitor Ch2 is correctly adjusted.

According to the third embodiment described above, because the sequential successive approximation type A/D conversion circuit 100 reduces the power consumption approximately in proportion to the power source voltage that is supplied, the reduction in the power consumption by the successive approximation type A/D conversion circuit 100 can be realized.

Furthermore, according to the third embodiment described above, an attenuation capacitance value can be adjusted to a suitable value in such a manner that the influence of a parasitic capacitance is reduced according to a process change and a change in temperature. Therefore, a full-scale range can be secured, and the successive approximation type A/D conversion circuit that operates in an optimal input dynamic range can be provided.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device, comprising:
    an amplification circuit configured to operate on the basis of a first power source voltage and perform sampling on an input signal and amplify the input signal;
    a downstream circuit configured to operate on the basis of a second power source voltage lower than the first power source voltage and operate in response to an output signal of the amplification circuit; and
    a clipping circuit,
    wherein the amplification circuit includes
        a sampling capacitor configured to hold the input signal on which the sampling is performed, as a signal whose reference is a first reference voltage,
        a feedback capacitor to which the signal that is held in the sampling capacitor is transferred, and an operational amplifier circuit configured to amplify the signal that is held in the sampling capacitor, according to a ratio between values of the sampling capacitor and the feedback capacitor, and output the amplified signal, as a signal whose reference is a second reference voltage, the clipping circuit includes
an overcurrent detection circuit configured to detect an overcurrent that occurs in a case where a voltage of an output signal of the operational amplifier circuit exceeds the second power source voltage, and
an overcurrent absorption circuit configured to absorb the overcurrent, and the clipping circuit is configured to limit the voltage of the output signal of the operational amplifier circuit to the second power source voltage or below.

2. The semiconductor device according to claim 1,
wherein the first reference voltage is a voltage that is higher than the second reference voltage.

3. The semiconductor device according to claim 1,
wherein the first reference voltage is set to a voltage within a range of one fourth to three fourths of the first power source voltage, and
the second reference voltage is set to a voltage within a range of one fourth to three fourths of the second power source voltage.

4. The semiconductor device according to claim 1, further comprising multiple pixels that are arranged in a matrix form,
wherein one or more of the amplification circuits are arranged with respect to columns of the multiple pixels.

5. The semiconductor device according to claim 1,
wherein the downstream circuit is a successive approximation type A/D conversion circuit.

6. The semiconductor device according to claim 5,
wherein the input signal is a reset signal and an image signal,
each of the reset signal and the image signal is held in the sampling capacitor and transferred to the feedback capacitor,
the operational amplifier circuit amplifies the difference between the reset signal and the image signal according to the ratio between values of the sampling capacitor and the feedback capacitor.

7. The semiconductor device according to claim 1,
wherein the operational amplifier circuit is a transconductance amplifier.

8. The semiconductor device according to claim 7,
wherein the transconductance amplifier is a telescopic-type transconductance amplifier.

* * * * *